(12) United States Patent
Abe et al.

(10) Patent No.: US 7,781,758 B2
(45) Date of Patent: Aug. 24, 2010

(54) SEMICONDUCTOR DEVICE

(75) Inventors: Hiroko Abe, Setagaya (JP); Yuji Iwaki, Atsugi (JP); Mikio Yukawa, Atsugi (JP); Shunpei Yamazaki, Setagaya (JP); Yasuyuki Arai, Atsugi (JP); Yasuko Watanabe, Atsugi (JP); Yoshitaka Moriya, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 486 days.

(21) Appl. No.: 11/587,441

(22) PCT Filed: Oct. 13, 2005

(86) PCT No.: PCT/JP2005/019253

§ 371 (c)(1),
(2), (4) Date: Oct. 25, 2006

(87) PCT Pub. No.: WO2006/043611

PCT Pub. Date: Apr. 27, 2006

(65) Prior Publication Data

US 2008/0048180 A1    Feb. 28, 2008

(30) Foreign Application Priority Data

Oct. 22, 2004    (JP)    ............................... 2004-308838

(51) Int. Cl.
*H01L 35/24*    (2006.01)
*H01L 51/00*    (2006.01)
(52) U.S. Cl. .................................. 257/40; 257/E51.001
(58) Field of Classification Search .................... 257/40
See application file for complete search history.

(56) References Cited

U.S. PATENT DOCUMENTS 3,833,894 A    9/1974   Aviram et al.

(Continued)

FOREIGN PATENT DOCUMENTS

CN    1440036    9/2003

(Continued)

OTHER PUBLICATIONS

Lemos, R., "RFID Tags Become Easy Target for Hacker," http://japan.cnet.com/news/sec/story/0,2000056024,20070122.00.htm, 2 pages, Jul. 29, 2004.

(Continued)

*Primary Examiner*—Kenneth A Parker
*Assistant Examiner*—Anthony Ho
(74) *Attorney, Agent, or Firm*—Eric J. Robinson; Robinson Intellectual Property Law Office, P.C.

(57) ABSTRACT

It is an object of the present invention to provide a semiconductor device in which data can be written except when manufacturing the semiconductor device and that counterfeits can be prevented. Moreover, it is another object of the invention to provide an inexpensive semiconductor device including a memory having a simple structure. The semiconductor device includes a field effect transistor formed over a single crystal semiconductor substrate, a first conductive layer formed over the field effect transistor, an organic compound layer formed over the first conductive layer, and a second conductive layer formed over the organic compound layer, and a memory element includes the first conductive layer, the organic compound, and the second conductive layer. According to the above structure, a semiconductor device which can conduct non-contact transmission/reception of data can be provided by possessing an antenna.

16 Claims, 24 Drawing Sheets

U.S. PATENT DOCUMENTS

| | | | |
|---|---|---|---|
| 4,115,872 A | 9/1978 | Bluhm | |
| 4,177,475 A | 12/1979 | Holmberg | |
| 5,375,250 A | 12/1994 | Van den Heuvel | |
| 5,621,247 A | 4/1997 | Hirao et al. | |
| 5,714,400 A | 2/1998 | Hirao et al. | |
| 6,340,588 B1 | 1/2002 | Nova et al. | |
| 6,509,217 B1 | 1/2003 | Reddy | |
| 6,528,815 B1 | 3/2003 | Brown et al. | |
| 6,683,322 B2 | 1/2004 | Jackson et al. | |
| 6,683,802 B2 | 1/2004 | Katoh | |
| 6,795,339 B2 | 9/2004 | Ooishi | |
| 6,809,952 B2 | 10/2004 | Masui | |
| 6,828,685 B2 | 12/2004 | Stasiak | |
| 6,847,047 B2 | 1/2005 | Van Buskirk et al. | |
| 6,847,541 B2 | 1/2005 | Tsujioka | |
| 6,950,331 B2 | 9/2005 | Yang et al. | |
| 6,962,844 B2 | 11/2005 | Stasiak | |
| 6,977,389 B2 | 12/2005 | Tripsas et al. | |
| 7,016,222 B2 | 3/2006 | Morikawa | |
| 7,050,326 B2 | 5/2006 | Anthony | |
| 7,220,985 B2 | 5/2007 | Cheung et al. | |
| 7,359,230 B2 | 4/2008 | Sumida et al. | |
| 2003/0156449 A1 | 8/2003 | Ooishi | |
| 2003/0183699 A1 | 10/2003 | Masui | |
| 2003/0227793 A1 | 12/2003 | Tsujioka | |
| 2003/0230746 A1 | 12/2003 | Stasiak | |
| 2004/0130939 A1 | 7/2004 | Morikawa | |
| 2004/0164302 A1 | 8/2004 | Arai et al. | |
| 2005/0017370 A1 | 1/2005 | Stasiak | |
| 2005/0174875 A1 | 8/2005 | Katoh | |
| 2006/0121670 A1 | 6/2006 | Stasiak | |
| 2006/0267068 A1 | 11/2006 | Sato et al. | |
| 2007/0153565 A1 | 7/2007 | Nomura et al. | |
| 2007/0194301 A1 | 8/2007 | Sezi et al. | |
| 2007/0230235 A1 | 10/2007 | Abe et al. | |
| 2008/0210928 A1 | 9/2008 | Abe et al. | |

FOREIGN PATENT DOCUMENTS

| | | |
|---|---|---|
| EP | 1 341 186 | 9/2003 |
| EP | 1 441 361 | 7/2004 |
| EP | 1 453 088 | 9/2004 |
| JP | 06-232271 | 8/1994 |
| JP | 2001-189431 | 7/2001 |
| JP | 2001-516964 | 10/2001 |
| JP | 2001-345431 | 12/2001 |
| JP | 2003-243631 | 8/2003 |
| JP | 3526550 | 5/2004 |
| JP | 2004-282050 | 10/2004 |
| WO | WO 99/14762 | 3/1999 |
| WO | WO 02/37500 | 5/2002 |
| WO | WO 03/107426 | 12/2003 |
| WO | WO 2004/015778 | 2/2004 |
| WO | WO 2005/096380 | 10/2005 |
| WO | WO 2006/043573 | 4/2006 |
| WO | WO 2006/043611 | 4/2006 |
| WO | WO 2006/043687 | 4/2006 |

OTHER PUBLICATIONS

International Search Report (Application No. PCT/JP2005/019253) dated Jan. 10, 2006.

Written Opinion (Application No. PCT/JP2005/019253) dated Jan. 10, 2006.

Office Action (Application No. 200580036112.1) dated Sep. 19, 2008.

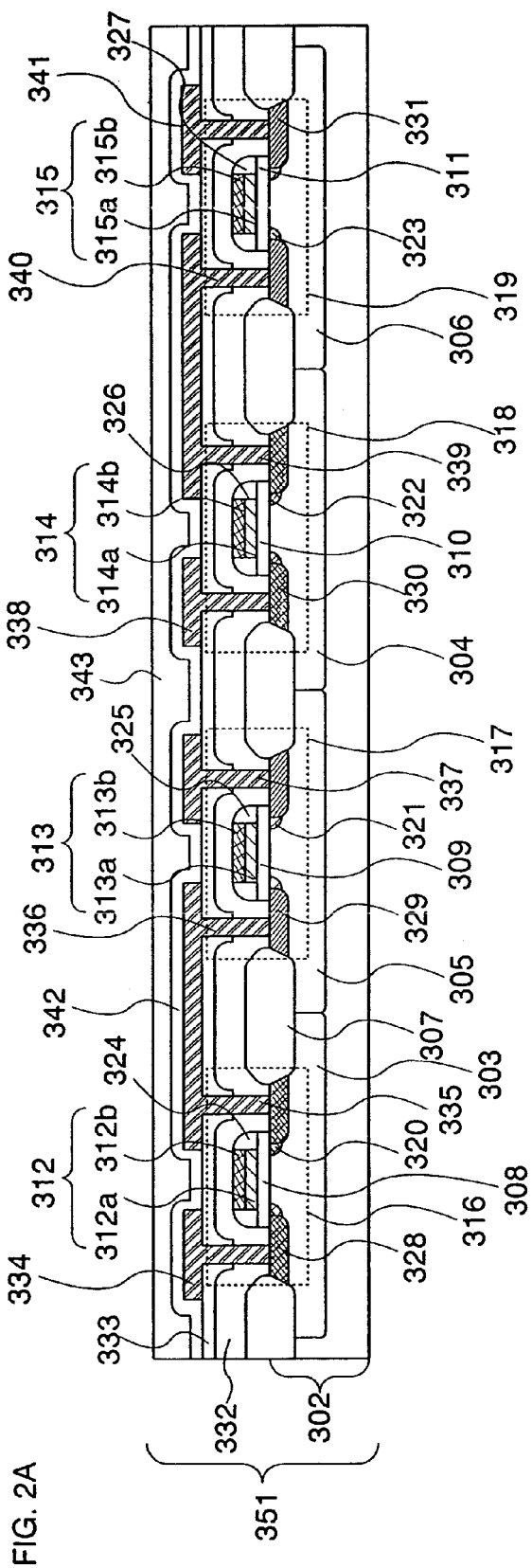
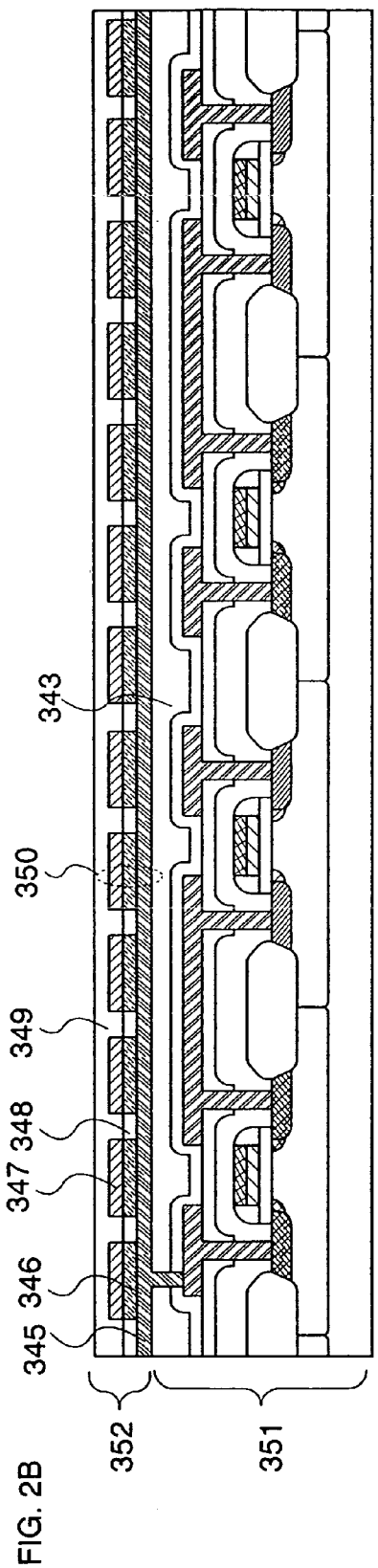
FIG. 2A
FIG. 2B 401  403  402

401  402  403

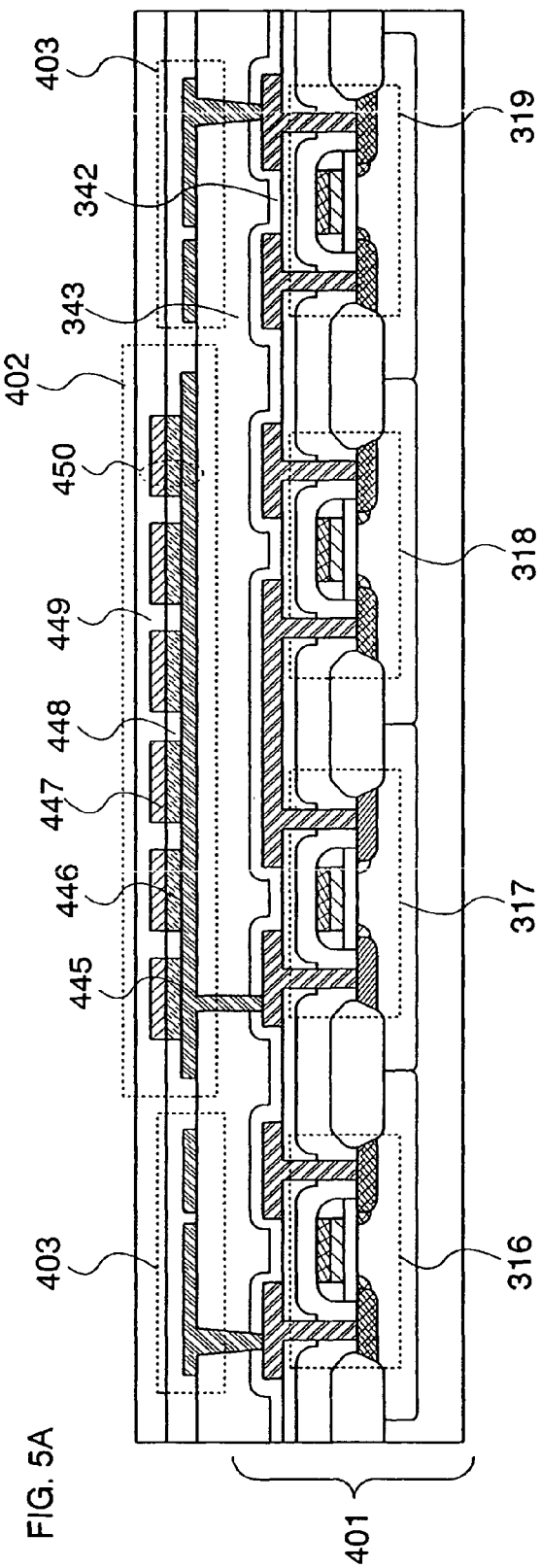
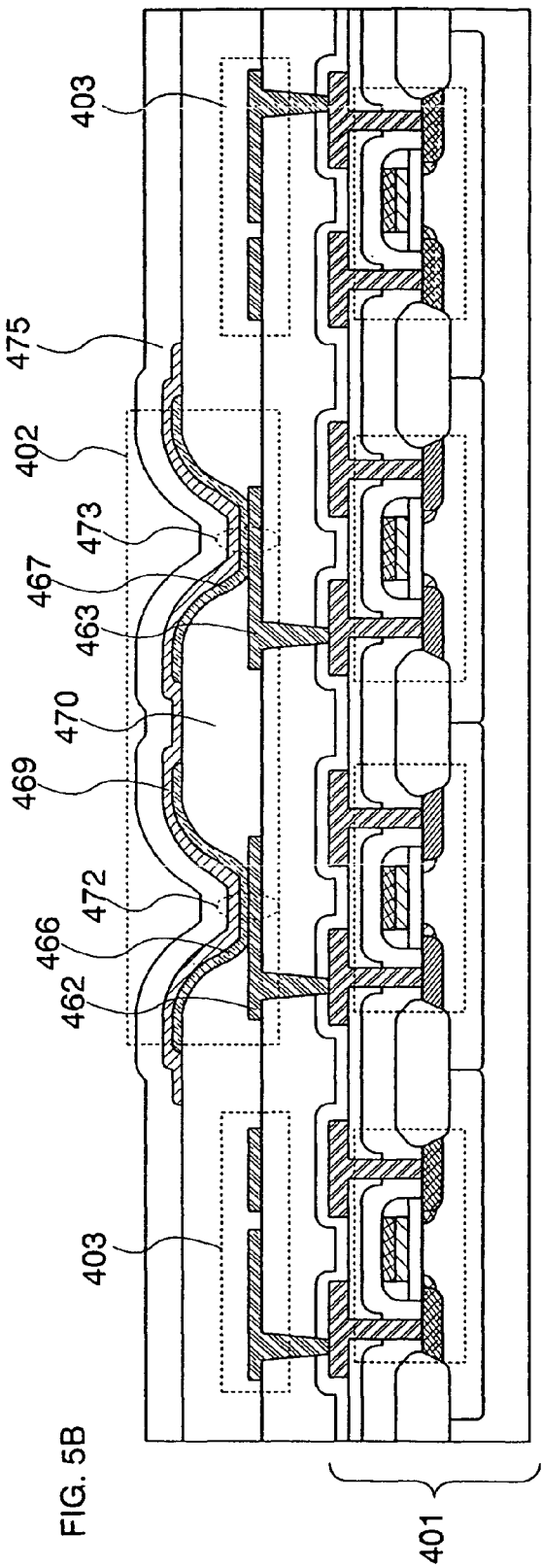
FIG. 5A
FIG. 5B 501　502　503

501　504　503　502

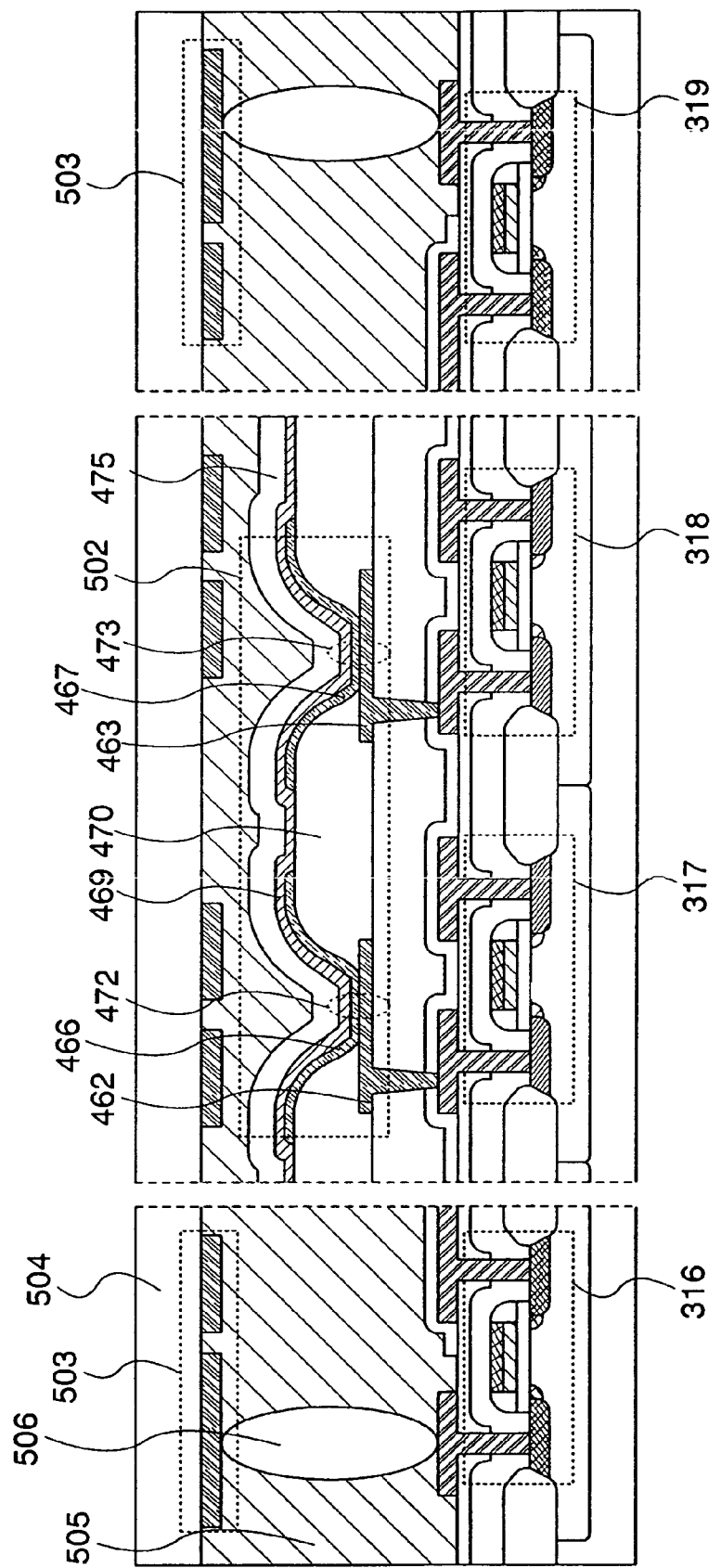

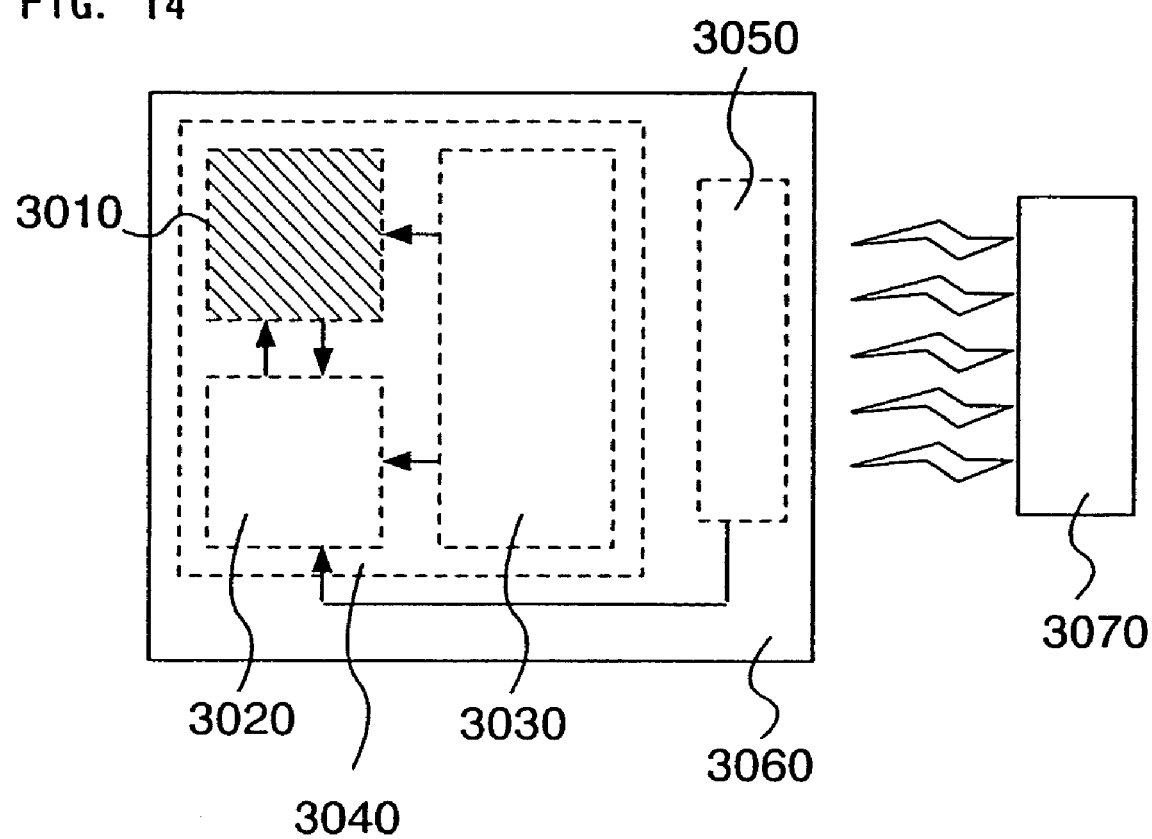

○ : before writing    □ : after writing

○: before writing     □: after writing

○ : before writing    □ : after writing sample 1 sample 2 sample 3 sample 4 sample 5 sample 6

SEMICONDUCTOR DEVICE

TECHNICAL FIELD

The present invention relates to a semiconductor device having a memory element. More specifically, the invention relates to a semiconductor device including an organic compound layer as the memory element.

BACKGROUND ART

In recent years, electronic devices using organic materials are widely developed, and organic ELs which are light emitting elements, organic TFTs, and the like are developed. In addition, memory elements using organic materials, for example, mask ROMs and the like utilizing organic diodes, are studied (for example, Patent Document 1: Japanese Patent Publication No. 2001-516964). In these memory elements, writing (writing once, reading many) data cannot be conducted except when manufacturing the memory element; therefore, the memory elements are inconvenient.

DISCLOSURE OF INVENTION

It is an object of the present invention to provide a semiconductor device in which data can be written except when manufacturing a chip and that counterfeits can be prevented. Moreover, it is another object of the invention to provide an inexpensive semiconductor device including a memory element having a simple structure.

To solve the above problem, a means hereinafter is adopted in the invention.

One embodiment of the invention is that a semiconductor device includes a field effect transistor formed over a single crystal semiconductor substrate; and a memory circuit provided above the field effect transistor, wherein the field effect transistor is formed using the single crystal semiconductor substrate as a channel region, wherein the memory circuit includes an organic memory element in which a first conductive layer, an organic compound layer, and a second conductive layer are sequentially stacked. The term "organic memory element" here refers to an element having a structure in which an organic compound layer is interposed between at least a pair of conductive layers.

Another embodiment of the invention is that a semiconductor device includes a field effect transistor formed using a single crystal semiconductor substrate as a channel region; a memory circuit provided above the field effect transistor; and a conductive layer serving as an antenna, wherein the memory circuit includes an organic memory element in which a first conductive layer, an organic compound layer, and a second conductive layer are sequentially stacked, and wherein the conductive layer serving as the antenna and the first conductive layer are provided in a same layer.

Another embodiment of the invention is that a semiconductor device includes a field effect transistor formed using a single crystal semiconductor substrate as a channel region; a memory circuit provided above the field effect transistor; and a conductive layer serving as an antenna which is provided above the memory circuit, wherein the memory circuit includes an organic memory element in which a first conductive layer, an organic compound layer, and a second conductive layer are sequentially stacked, and wherein the conductive layer serving as the antenna is pasted so as to be electrically connected to the field effect transistor.

Another embodiment of the invention provides a semiconductor device having the above structure, wherein a memory circuit includes an organic memory element having a first conductive layer electrically connected to a field effect transistor, an insulating layer provided so as to cover the edge portion of the first conductive layer, an organic compound layer provided over the first conductive layer and the insulating layer, and a second conductive layer provided over the organic compound layer.

Another embodiment of the invention provides a semiconductor device having the above structure, wherein a memory circuit includes an organic memory element having a first conductive layer electrically connected to a field effect transistor, an insulating layer provided so as to cover the edge portion of the first conductive layer, an organic compound layer provided so as to cover the first conductive layer which is not covered with the insulating layer and the edge portion of the insulating layer, and a second conductive layer provided so as to cover the organic compound layer and the insulating layer which is not covered with the organic compound layer.

Another embodiment of the invention provides a semiconductor device having the above structure, wherein one or both of the first conductive layer and the second conductive layer have a light-transmitting property. This structure is required when data is written (written once, read many) to a memory circuit by optical action.

Another embodiment of the invention provides a semiconductor device having the above structure, wherein resistance of an organic memory element changes irreversibly by writing processing which applies voltage.

Another embodiment of the invention provides a semiconductor device having the above structure, wherein the distance between the first conductive layer and the second conductive layer of the organic memory element changes when data is written to the memory circuit. The change of the distance between the first conductive layer and the second conductive layer by writing data is different depending on the location of the organic memory element, and the distance is wide in one location and narrow in another location.

Another embodiment of the invention provides a semiconductor device having the above structure, wherein the organic compound layer is formed from an electron transporting material or a hole transporting material. More specifically, the conductivity of the organic compound layer is $10^{-15}$ S/cm or more to $10^{-3}$ S/cm or less.

Another embodiment of the invention provides a semiconductor device having the above structure, wherein the film thickness of the organic compound layer is 5 nm to 60 nm.

Another embodiment of the invention provides a semiconductor device having the above structure, wherein one or a plurality of memories selected from a DRAM (Dynamic Random Access Memory), a SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Read Only Memory), and a flash memory is included as the memory circuit as well as the organic memory element.

Another embodiment of the invention provides a semiconductor device having the above structure, wherein one or a plurality of circuits selected from a power supply circuit, a clock generator circuit, a data demodulator/modulator circuit, and an interface circuit is included.

According to the invention, the organic compound layer can be formed by a vapor deposition method, a droplet discharge method, a screen printing method, a spin coating method, or the like. A droplet discharge method is a method for forming a film layer by discharging (jetting) droplets (also referred to dots) of a compound containing a material such as a conductor, an insulator, or the like in arbitrary locations and also referred to as an ink-jet method depending on the method.

According to the invention, a semiconductor device in which data can be written (written once, read many) except when manufacturing a memory circuit and that counterfeits can be prevented. In addition, a semiconductor device according to the invention can operate at high speed since a transistor using a single crystal semiconductor layer having favorable mobility and response speed as a channel portion is included. Further, according to the invention, a memory element having a simple structure can be formed; therefore, a semiconductor device having an inexpensive and highly integrated memory element can be provided.

BRIEF DESCRIPTION OF THE DRAWINGS

In the accompanying drawings:

FIGS. 2A and 2B are explanatory views of one example of the structure of a semiconductor device according to the invention;

FIGS. 5A and 5B are explanatory views of one example of the structure of a semiconductor device according to the invention;

FIG. 8 is an explanatory view of one example of the structure of a semiconductor device according to the invention;

FIG. 14 is an explanatory view of one example of the structure of a semiconductor device according to the invention;

BEST MODE FOR CARRYING OUT THE INVENTION

Embodiment modes according to the present invention are explained in detail with reference to the drawings. However, it is easily understood by those who are skilled in the art that embodiments and details herein disclosed can be modified in various ways without departing from the purpose and the scope of the present invention. Therefore, it should be noted that the description of embodiment modes to be given below should not be interpreted as limiting the invention. Through the drawings of the embodiments according to the invention, like components are denoted by like numerals as of these embodiments with each other and may not be further explained.

Embodiment Mode 1

In this embodiment mode, one example of the structure of a semiconductor device according to the present invention is explained with reference to FIGS. 1 to 3.

Figure 1:
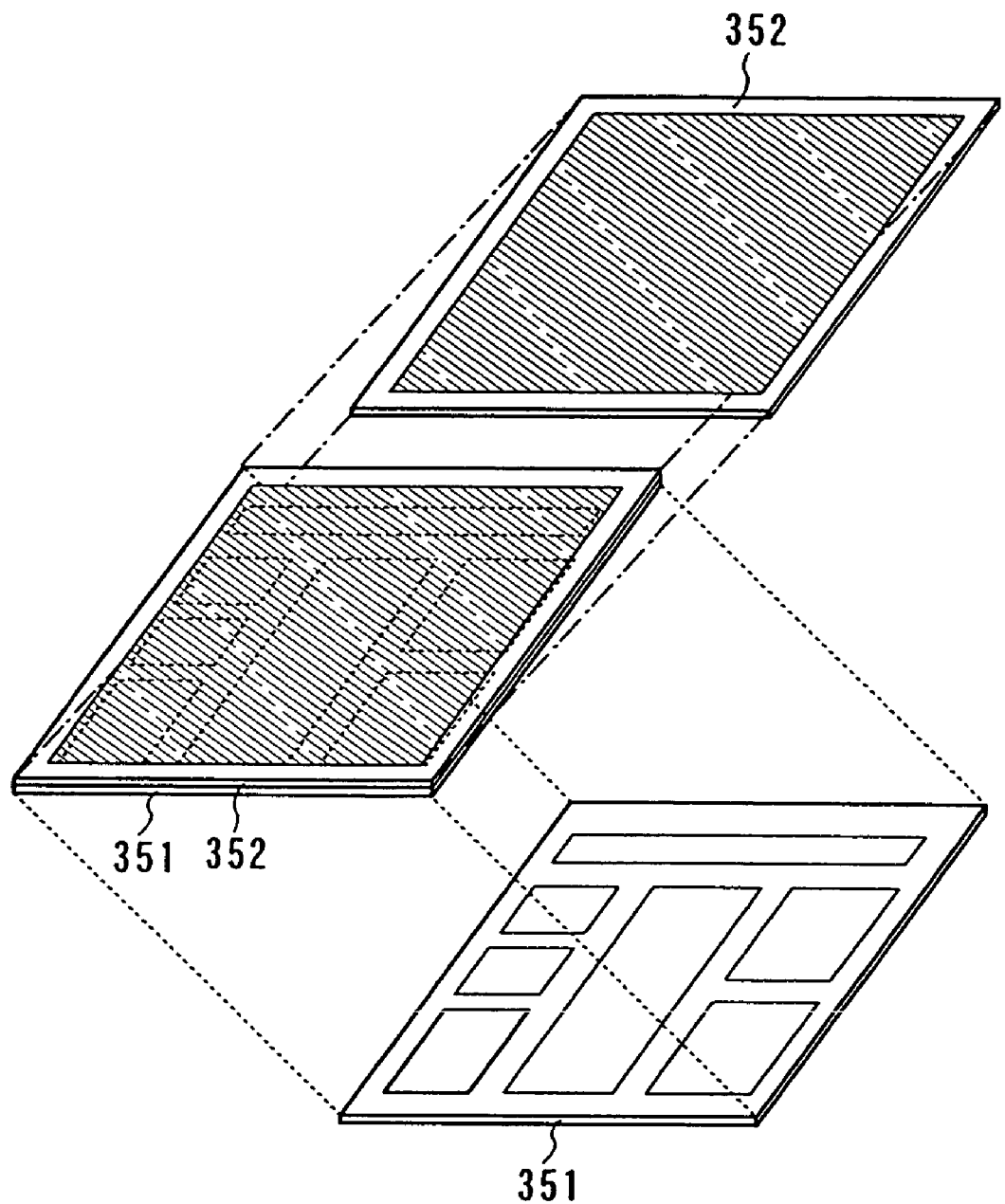
FIG. 1 is an explanatory view of one example of the structure of a semiconductor device according to the present invention.

A semiconductor device according to the invention has a structure in which a plurality of circuits is integrated, which includes a layer 351 including a plurality of field effect transistors (FETs) and a layer 352 including a plurality of memory elements are sequentially stacked (FIG. 1). Various circuits are configured by the layer 351 including a plurality of field effect transistors, and the layer 352 including the plurality of memory elements has a memory circuit for storing data.

Next, the cross-sectional structure of a semiconductor device having the above structure is explained. First, the cross-sectional structure of the layer 351 including a plurality of field effect transistors is explained (FIG. 2A).

A field effect transistor is formed over a single crystal semiconductor substrate 302. N-wells 303 and 304 and p-wells 305 and 306 are formed in the single crystal semiconductor substrate 302, each of which is separated by a field oxide film 307. The structure is not limited to the above structure, and a structure provided with only a p-well in the case of using a n-type single crystal semiconductor substrate or a structure provided with only a n-well in the case of using a p-type single crystal semiconductor substrate may be employed.

Gate insulating films 308 to 311 are thin films formed by a thermal oxidation method. Gates 312 to 315 are formed, by a CVD method or the like, of polycrystalline silicon layers 312a to 315a having film thicknesses of from 100 nm to 300 nm and silicide layers 312b to 315b having film thicknesses of from 50 nm to 300 nm. Sidewalls 324 to 327 can be formed by making an insulating layer remain on a side wall of the gates 312 to 315 by anisotropic etching after forming the insulating layer over a whole surface of the substrate.

An impurity element which imparts p-type conductivity is added to a source/drain region 328 of a p-channel FET 316 and a source/drain region 330 of a p-channel FET 318. On the other hand, an impurity element which imparts n-type conductivity is added to a source/drain region 329 of a n-channel FET 317 and a source/drain region 331 of a n-channel FET 319.

An impurity element which imparts p-type conductivity is added to a low concentration impurity region (LDD region) 320 of the p-channel FET 316 and a low concentration impurity region (LDD region) 322 of the p-channel FET 318. An impurity element which imparts n-type conductivity is added to a low concentration impurity region (LDD region) 321 of the n-channel FET 317 and a low concentration impurity region (LDD region) 323 of the n-channel FET 319. These low concentration impurity regions are regions formed in a self-aligned manner by an ion implantation method or an ion doping method. A semiconductor device according to the invention is not limited to the above structure, and a sidewall and a LDD region are not required to be provided or a salicide (self-aligned silicide) structure may be employed.

Insulating layers 332 and 333 are provided so as to cover the p-channel FETs 316 and 318 and n-channel FETs 317 and 319. The insulating layers 332 and 333 are thin films provided to even a surface.

Source/drain wirings 334 to 341 are wirings which are in contact with the source/drain regions 328 to 331, respectively, and which fills contact holes provided for the insulating layers 332 and 333. Insulating layers 342 and 343 are provided so as to cover the source/drain wirings 334 to 341. The insulating layers 342 and 343 are also thin films provided to even a surface.

Next, a cross-sectional structure of a semiconductor device in which the layer 352 including a plurality of memory elements over the layer 351 including a plurality of field effect transistors is explained (refer to FIG. 2B).

A first conductive layer 345, an organic compound layer 346, and a second conductive layer 347 are sequentially stacked over the insulating layer 343, and this stacked body corresponds to a memory element 350. An insulating layer 348 is provided between the organic compound layers 346. An insulating layer 349 is provided over a plurality of the memory elements 350. A minute structure can be easily integrated and a semiconductor device including a memory element having large capacity can be provided at low cost by providing a plurality of memory elements having a simple structure (passive matrix type) over a field effect transistor as shown in FIG. 2B.

Next, a cross-sectional structure of a semiconductor device which is different from FIG. 2B is explained with reference to FIG. 3.

First conductive layers 361 to 364 are provided so that each of the first conductive layers 361 to 364 is connected to a source/drain wiring connected to a field effect transistor over an insulating layer 343, and organic compound layers 365 to 368 are provided so as to be in contact with the first conductive layers 361 to 364, respectively. Further, a second conductive layer 369 is provided so as to be in contact with the organic compound layers 365 to 368. The first conductive layers 361 to 364 or the second conductive layer 369 can be formed from a known conductive material such as aluminum (Al), copper (Cu), silver (Ag), or indium tin oxide (ITO) having a light-transmitting property. The organic compound layers 365 to 368 can be formed by a vapor deposition method or a droplet discharge method. In the case of forming by a droplet discharge method, a mask is not required since the organic compound layer can be selectively formed in a desired place, and in addition, there is an advantage that usability of a material is enhanced since only minimum material is required.

A stacked body of one of the first conductive layers 361 to 364 and the second conductive layer 369 corresponds to one of memory elements 371 to 374. An insulating layer 370 is provided between the organic compound layers 365 to 368. An insulating layer 375 is provided over a plurality of memory elements 371 to 374. In the structure of the semiconductor device shown in FIG. 3, a field effect transistor provided for a layer 351 including a field effect transistor serves as a switching element when writing or reading to the memory elements 371 to 374 is conducted; therefore, the field effect transistor provided for the layer 351 including a field effect transistor is preferably provided using one of structures of a p-channel FET and a n-channel FET. According to the above structure, a semiconductor device which can operate at high speed and in which operating frequency is enhanced can be provided since a transistor using a single crystal semiconductor layer with a favorable mobility or response speed as a channel portion is included.

Next, the structure of a semiconductor device having a function of non-contact transmission/reception of data is explained hereinafter with reference to FIGS. 4A to 5B.

Figure 4A:
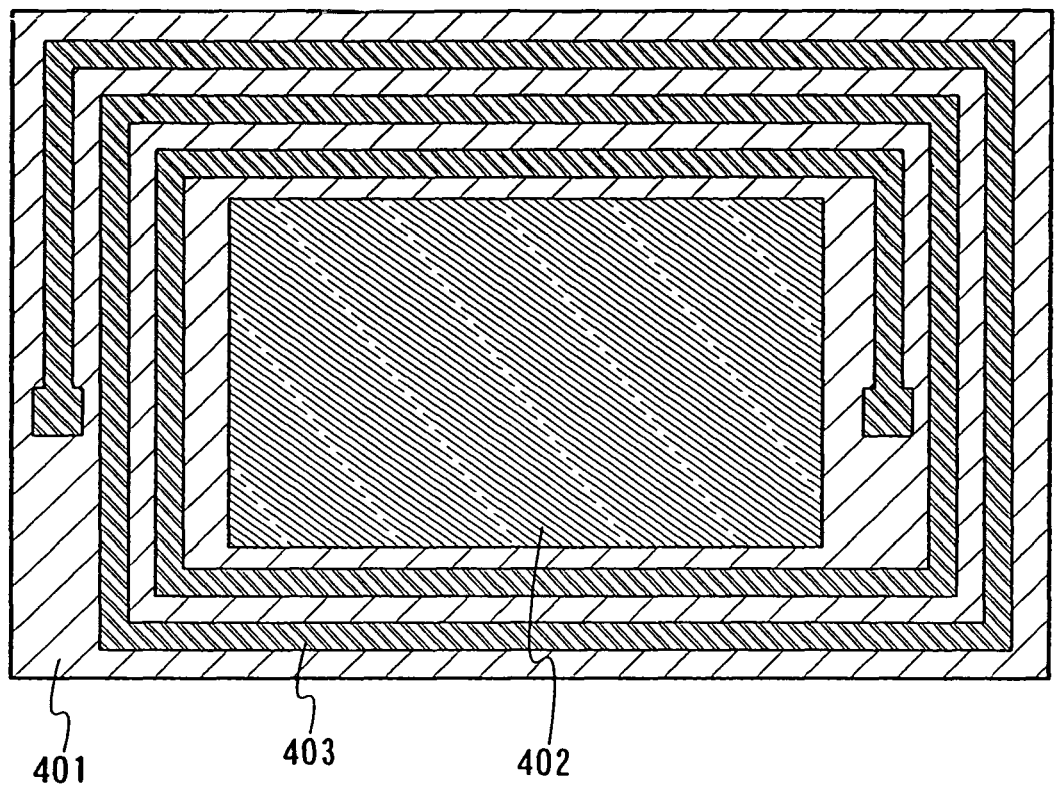
FIGS. 4A and 4B are explanatory views of one example of the structure of a semiconductor device according to the invention.
Figure 4B:
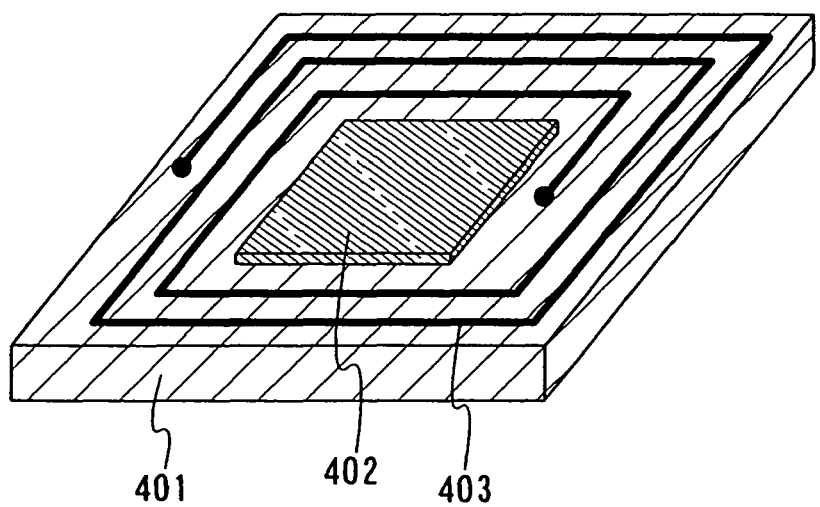

A semiconductor device shown in FIGS. 4A and 4B has a structure in which a plurality of circuits are integrated, in which a layer 401 including a plurality of field effect transistors and a layer 402 including a plurality of memory elements are sequentially stacked, and a conductive layer 403 serving as an antenna is provided in the periphery of the layer 402 including the plurality of memory elements (FIGS. 4A and 4B). FIG. 4A is a top view and FIG. 4B is a perspective view.

A cross-sectional structure of a semiconductor device having the above structure is explained with reference to FIG. 5A.

In FIG. 5A, a layer 401 including a plurality of field effect transistors has a p-channel FET 316, a n-channel FET 317, a p-channel FET 318, and a n-channel FET 319. The structures of these FETs are shown in FIG. 2B; therefore, the explanation is omitted.

Insulating layers 342 and 343 are provided so as to cover the p-channel FET 316, the n-channel FET 317, the p-channel FET 318, and the n-channel FET 319, and a layer 402 including a plurality of memory elements is provided over the insulating layer 343. A conductive layer 403 serving as an antenna is provided in the periphery of the layer 402 including the plurality of memory elements.

As for the layer 402 including the plurality of memory elements, a first conductive layer 445, an organic compound layer 446, and a second conductive layer 447 are sequentially stacked over the insulating layer 343, and this stacked body corresponds to a memory element 450. An insulating layer 448 is provided between the organic compound layers 446.

The conductive layer 403 serving as an antenna is provided in the same layer as the first conductive layer 445. Insulating layers 448 and 449 are provided over the conductive layer 403. The conductive layer 403 serving as an antenna is connected to a transistor included in a rectification circuit or a waveform shaping circuit. An alternating current signal inputted from outside by a non-contact method is processed in a rectification circuit or a waveform shaping circuit, then the data is exchanged (the data is written and/or read) with an organic memory element through a reading circuit or a writing circuit. Here, the conductive layer 403 is connected to a source/drain wiring 334 of the p-channel FET 316 and a source/drain wiring 341 of the n-channel FET 319. The conductive layer 403 can be formed from a material such as copper (Cu), aluminum (Al), silver (Ag), or gold (Au). In addition, the conductive layer 403 may be manufactured through the same manufacturing process as that of the first conductive layer 445.

Next, a cross-sectional structure of a semiconductor device which is different from the structure shown in FIG. 5A is explained with reference to FIG. 5B. For more details, a cross-sectional structure of a semiconductor device in which a layer 402 including a plurality of memory elements has a different structure from that in FIG. 5A is explained.

Figure 3:
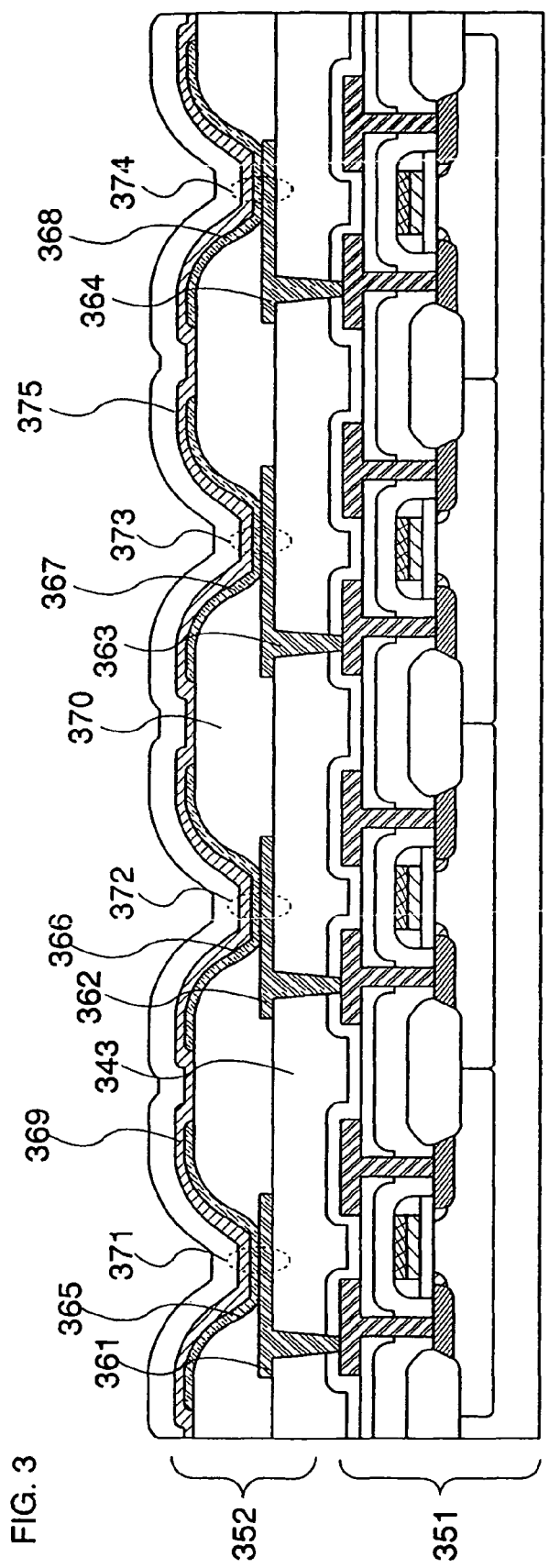
FIG. 3 is an explanatory view of one example of the structure of a semiconductor device according to the invention.

In FIG. 5B, a layer 401 including a plurality of field effect transistors can be provided in the similar way as the structure shown in FIG. 3. As for a layer 402 including a plurality of memory elements, first conductive layers 462 and 463 are provided so as to be connected to source drain wirings 336 and 338, respectively, and organic compound layers 466 and 467 are provided so as to be in contact with the first conductive layers 462 and 463, respectively. Further, a second conductive layer 469 is provided so as to be in contact with the organic compound layers 466 and 467.

A stacked body of any one of the first conductive layers 462 and 463, any one of the organic compound layers 466 and 467, and the second conductive layer 469 corresponds to any one of memory elements 472 and 473. An insulating layer 470 is provided between the organic compound layers 466 and 467. Further, an insulating layer 475 is provided over a plurality of the memory elements 472 and 473.

In the structure of the semiconductor device shown in FIG. 5B, each of the field effect transistors connected to the first conductive layers 462 and 463 serves as a switching element when writing or reading to the memory elements 472 and 473 is conducted; therefore, the above field effect transistors are preferably provided using one of structures of a p-channel FET and a n-channel FET. Further, the other field effect transistors may be provided using one of structures of a p-channel FET and a n-channel FET, may be provided using both of a p-channel FET and a n-channel FET, or may be provided as a CMOS circuit by combining a p-channel FET with a n-channel FET.

As shown in FIGS. 4A to 5B, a semiconductor device having a function of non-contact transmission/reception of data can be provided by forming a conductive layer serving as an antenna. Such a semiconductor device can be utilized for a wireless chip or the like which conducts non-contact transmission/reception of data. In addition, most of the wireless chips and the like are required to have a minute structure; however, a semiconductor device having a high-integrated and inexpensive memory element can be provided by using the structure shown in FIGS. 5A and 5B.

Next, the structure of a semiconductor device which is different from that of FIGS. 4A to 5B in the case of conducting non-contact transmission/reception of data is explained with reference to FIGS. 6A to 8.

Figure 6A:
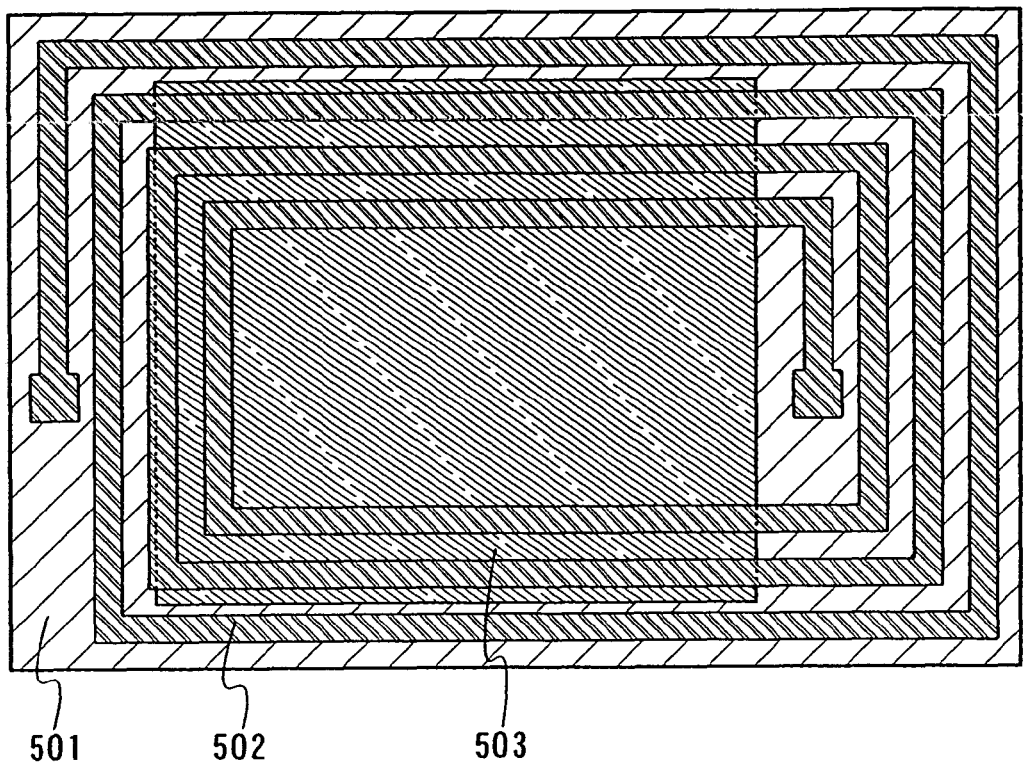
FIGS. 6A and 6B are explanatory views of one example of the structure of a semiconductor device according to the invention.
Figure 6B:
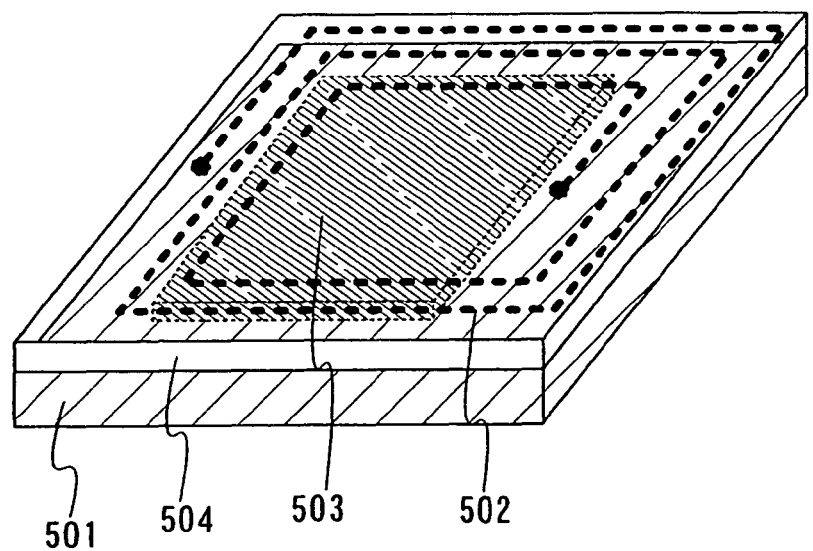

A semiconductor device according to the invention has a structure in which a plurality of circuits are integrated and has a structure of pasting a substrate provided by sequentially stacking a layer 501 including a plurality of field effect transistors and a layer 502 including a plurality of memory elements and a substrate provided with a conductive layer 503 serving as an antenna (FIGS. 6A and 6B). FIG. 6A is a top view and FIG. 6B is a perspective view.

A cross-sectional structure of a semiconductor device according to the invention having the above structure is explained with reference to FIG. 7.

A layer 501 including a plurality of field effect transistors has a p-channel FET 316, a n-channel FET 317, a p-channel FET 318, and a n-channel FET 319. The structures of these FETs are shown in FIG. 2B; therefore, the explanation is omitted.

A layer 502 including a plurality of memory elements can be provided in the similar way as a layer 402 including a plurality of memory elements explained using FIG. 5A.

A substrate having the layer 501 including the plurality of field effect transistors and the layer 502 including the plurality of memory elements and a substrate 504 provided with a conductive layer 503 are pasted with a resin 505 including a conductive particle 506. As a method for forming an element by pasting, for example, after pasting a semiconductor substrate having a circular shape and a substrate 504 provided with a plurality of conductive layers, the semiconductor substrate having a circular shape and the substrate 504 which are pasted to each other may be divided to form individual elements. Further, a substrate 504 provided with a plurality of conductive layers may be divided after pasting a Si substrate which is divided in advance to the substrate 504 to form individual elements, or each of a semiconductor substrate and a substrate 504 may be divided in advance and pasted to form individual elements.

A source/drain wiring 334 of the p-channel FET 316 and a source/drain wiring 341 of the n-channel FET 319 is electrically connected to the conductive layer 503 through the conductive particle 506. Here, a case of connecting using an anisotropic conductive film including a conductive microparticle is explained; however, a method using a conductive adhesive agent such as Ag paste, Cu paste, or carbon paste, or a method for conducting a solder joint may be used.

Figure 7:
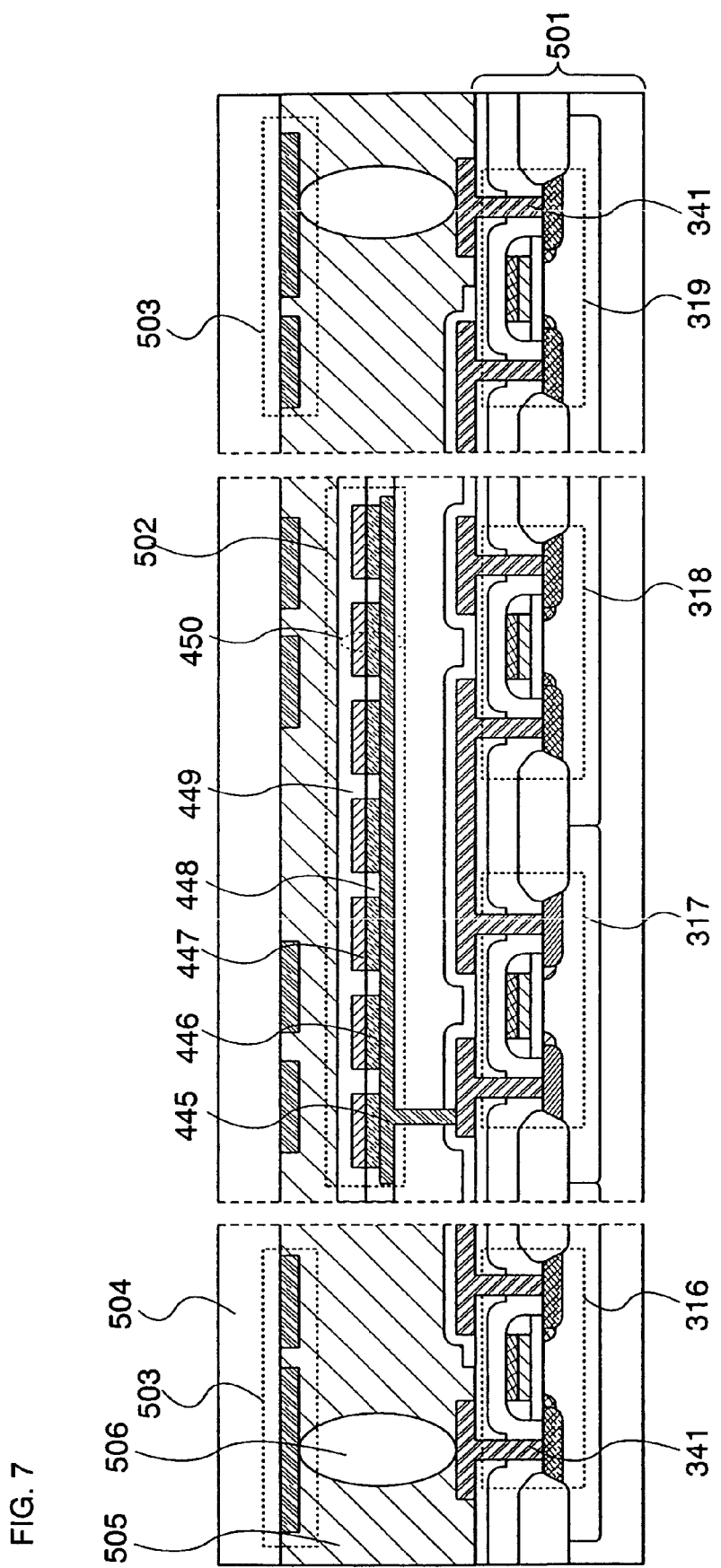
FIG. 7 is an explanatory view of one example of the structure of a semiconductor device according to the invention.

Next, a cross-sectional structure of a semiconductor device which is different from a structure shown in FIG. 7 is explained with reference to FIG. 8. For more details, a cross-sectional structure of a semiconductor device in which a structure of a layer 502 including a plurality of memory elements is different from that in FIG. 7 is explained.

A layer 501 including a plurality of field effect transistors can be formed as shown in FIG. 5B. A layer 502 including a plurality of memory elements has the same structure as a layer 402 including a plurality of memory elements which is explained using FIG. 5B. A substrate having the layer 501 including the plurality of field effect transistors and the layer 502 including the plurality of memory elements and a substrate 504 provided with a conductive layer 503 are pasted with a resin 505 including a conductive particle 506 in the similar way as the structure shown in FIG. 7. A source/drain wiring 334 and a source/drain wiring 341 is electrically connected to the conductive layer 503 through the conductive particle 506.

As shown in FIGS. 6A to 8, a substrate provided by sequentially stacking the layer 501 including the plurality of field effect transistors and the layer 502 including the plurality of memory elements and a conductive layer 503 serving as an antenna are pasted; accordingly, the area of the conductive layer 503 can be formed to have a large size easily compared with a structure shown in FIG. 5A. Conducting resistance can be kept low by forming the area of the conductive layer to be wide; therefore, communication distance of a semiconductor device can be extended in non-contact transmission/reception of data.

Embodiment Mode 2

In this embodiment mode, the structure of a memory element shown in Embodiment Mode 1 is explained hereinafter.

The present invention has a feature that the memory element (hereinafter, also referred to as an organic memory element) shown in the above embodiment mode includes an organic compound layer. A memory may include only an organic memory element or may include other memory element. A memory including an organic memory element (hereinafter, also referred to as an organic memory) utilizes the material of an organic compound and makes electric resistance change by optical action or by electric action to the organic compound layer.

Figure 13:
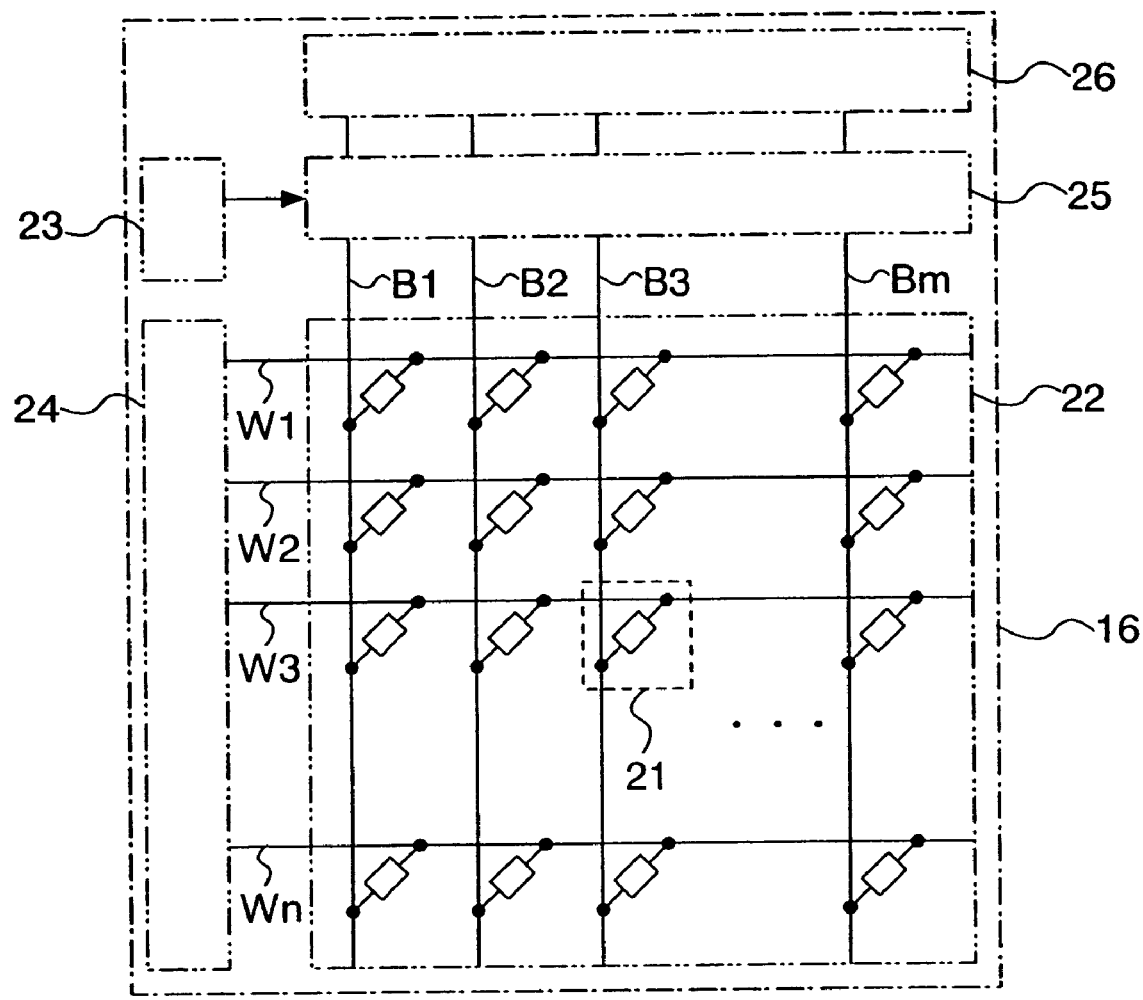
FIG. 13 is an explanatory view of a semiconductor device and a driving method thereof according to the invention.

The structure of the organic memory is explained with reference to FIG. 13. The organic memory includes a memory cell array 22 provided with a plurality of memory cells 21 in a matrix, decoders 23 and 24, a selector 25, and a reading/writing circuit 26. The structure of the organic memory shown in FIG. 13 corresponds to the structure (passive matrix) of a memory element of a layer 402 including a plurality of memory elements in FIGS. 2B and 5A or a layer 502 including a plurality of organic memory elements in FIG. 7.

The memory cell 21 includes a first conductive layer which is to be connected to a bit line Bx ($1 \leq x \leq m$), a second conductive layer which is to be connected to a word line Wy ($1 \leq y \leq n$), and an organic compound layer. The organic compound layer is provided between the first conductive layer and the second conductive layer.

Next, a top structure and a cross-sectional structure of the memory cell array 22 is explained with reference to FIGS. 9A, 9B-1 and 9B-2. The memory cell array 22 includes a first conductive layer 27 extended in a first direction, a second conductive layer 28 extended in a second direction which is different from the first direction, and an organic compound layer 29 over a layer (hereinafter, referred to as a substrate 30) including a field effect transistor shown in the above embodiment mode. The first conductive layer 27 and the second conductive layer 28 are formed so as to intersect with each other and be in a striped shape. An insulating layer 33 is provided between the adjacent organic compound layers 29. Further, an insulating layer 34 serving as a protective layer is provided so as to be in contact with the second conductive layer 28.

The first conductive layer 27 and second conductive layer 28 are formed from a known conductive material such as aluminum (Al), copper (Cu), or silver (Ag). The organic compound layer 29 may be formed by a vapor deposition method or a droplet discharge method. In the case of using a droplet discharge method, usability of the material is enhanced since the organic compound layer can be selectively provided in each memory cell.

In the case of writing data by light, the second conductive layer 28 is formed so as to have a light-transmitting property. The conductive layer having a light-transmitting property is formed from a transparent conductive material such as indium tin oxide (ITO) or formed so as to have a thickness through which light is transmitted other than a transparent conductive material. In the case where a conductive layer serving as an antenna is provided over a memory element in the above embodiment mode, the conductive layer is not provided above the portion of the memory element where data is to be written in order to provide an opening window where light can be emitted. A light shielding film is preferably provided so that light is not emitted to a field effect transistor provided below the memory element. Concretely, in the case of writing data by applying optical action to a semiconductor device shown in FIG. 2B, at least one layer selected from the insulating layers 332, 333, 342, and 343 is formed of a light shielding film. Preferably, at least one of the insulating layers 342 and 343 is formed of a light shielding film.

The organic compound layer 29 can be formed from an organic compound material having conductivity (preferably, conductivity of $10^{-15}$ S/cm or more to $10^{-3}$ S/cm or less), and a highly hole transporting material such as an aromatic amine-based (that is, a bond of benzene ring—nitrogen is included) compound such as 4,4'-bis[N-(1-naphthyl)-N-phenylamino]biphenyl (abbreviated to α-NPD), 4,4'-bis[N-(3-methylphenyl)-N-phenylamino]biphenyl (abbreviated to TPD), 4,4',4''-tris(N,N-diphenylamino)triphenylamine (abbreviated to TDATA), 4,4',4''-tris[N-(3-methylphenyl)-N-phenylamino]triphenylamine (abbreviated to MTDATA), or 4,4'-bis(N-(4-(N,N-di-m-tolylamino)phenyl)-N-phenylamino)biphenyl (abbreviated to DNTPD) or a phthalocyanine compound such as phthalocyanine (abbreviated to $H_2Pc$), copper phthalocyanine (abbreviated to CuPc), or vanadyl phthalocyanine (abbreviated to VOPc) can be used.

Further, a highly electron transporting material can be used as the organic compound material, and for example, a material formed from a metal complex or the like having a quinoline skeleton or a benzoquinoline skeleton, such as tris(8-quinolinolato)aluminum (abbreviated to $Alq_3$), tris(4-methyl-8-quinolinolato)aluminum (abbreviated to $Almq_3$), bis(10-hydroxybenzo[h]-quinolinato)beryllium (abbreviated to $BeBq_2$), or bis(2-methyl-8-quinolinolato)-4-phenylphenolato-aluminum (abbreviated to $BAlq_2$) or a material such as a metal complex having an oxazole-based or thiazole-based ligand, such as bis[2-(2-hydroxyphenyl)benzoxazolato]zinc (abbreviated to $Zn(BOX)_2$) or bis[2-(2-hydroxyphenyl)benzothiazolato]zinc (abbreviated to $Zn(BTZ)_2$) may be used. Further, in addition to a metal complex, a compound or the like such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), or bathocuproin (abbreviated to BCP) may be used.

Further, as other organic compound materials, 4-dicyanomethylene-2-methyl-6-[2-(1,1,7,7-tetramethyljulolidine-9-yl)ethenyl]-4H-pyran (abbreviated to DCJT), 4-dicyanomethylene-2-t-butyl-6-[2-(1,1,7,7-tetramethyljulolidine-9-yl)ethenyl]-4H-pyran, periflanthene, 2,5-dicyano-1,4-bis[2-(10-methoxy-1,1,7,7-tetramethyljulolidine-9-yl)ethenyl]benzene, N,N'-dimethylquinacridone (abbreviated to DMQd), coumarin 6, coumarin 545T, tris(8-quinolinolato)aluminum (abbreviated to $Alq_3$), 9,9'-biathlyl, 9,10-diphenylanthracene (abbreviated to DPA), 9,10-bis(2-naphthyl)anthracene (abbreviated to DNA), 2,5,8,11-tetra-t-butylperylene (abbreviated to TBP), or the like can be given. An anthracene derivative such as 9,10-di(2-naphthyl)-2-tert-butylanthracene (abbreviated to t-BuDNA); a carbazole derivative such as 4,4'-bis(N-carbazolyl)biphenyl (abbreviated to CBP); a metal complex such as bis[2-(2-hydroxyphenyl)pyridinato]zinc (abbreviated to $Znpp_2$) or bis[2-(2-hydroxyphenyl)benzoxazolate]zinc (abbreviated to ZnBOX); or the like can be used as a material to be a base material in the case of forming a layer in which the light-emitting material is diffused tris(8-quinolinolato)aluminum (abbreviated to Alq$_3$), 9,10-bis(2-naphthyl)anthracene (abbreviated to DNA), bis(2-methyl-8-quinolinolato)-4-phenylphenolate-aluminum (abbreviated to BAlq), or the like can be used. The organic compounds described above can be provided in a single layer or a stacked layer, and may be arbitrarily selected by a practitioner.

Further, a material in which electric resistance changes by optical action or electric action can be used. For example, a conjugated polymer doped with a compound (photoacid generator) generating acid by means of absorbing light can be used. Here, as the conjugated polymer, polyacetylenes, polyphenylene vinylenes, polythiophenes, poly anilines, polyphenylene ethinylenes, or the like can be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF$_6$ salt, or the like can be used.

Figure 9A:
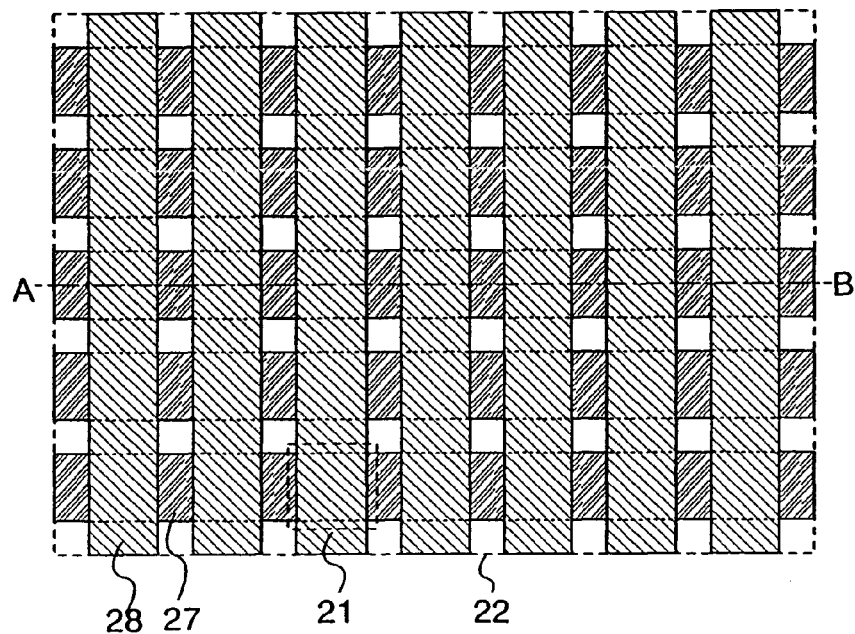
FIGS. 9A to 9C are explanatory views of a semiconductor device and a driving method thereof according to the invention.
Figures 1, 9B:
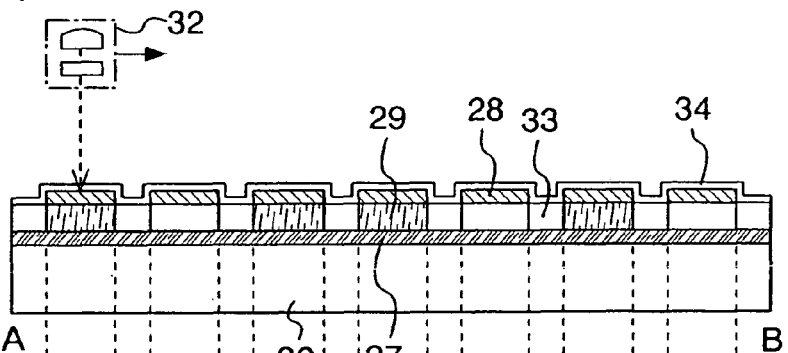
Figures 2, 9B:
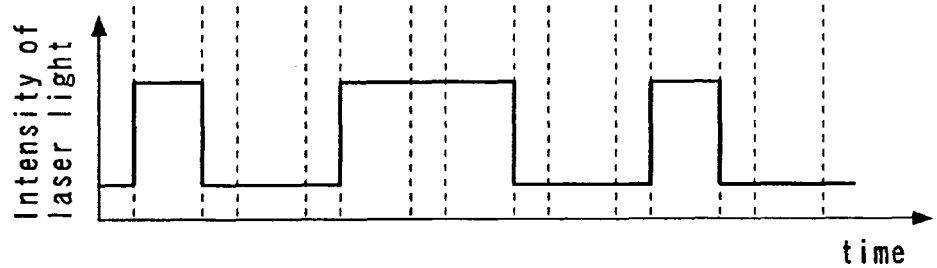
Figure 9C:
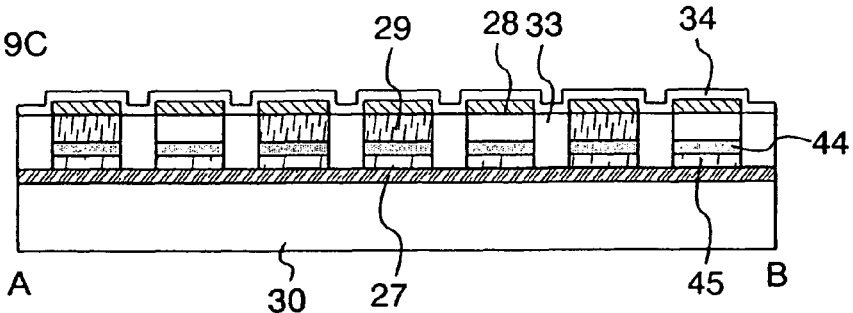

As a different structure from the above structure, a rectifying element may be provided between the first conductive layer 27 and the organic compound layer 29 or between the second conductive layer 28 and the organic compound layer 29 (refer to FIG. 9C). The rectifying element refers to a Schottky diode, a PN junction diode, a PIN junction diode, or a transistor in which a gate electrode and a drain electrode are connected. Obviously, the rectifying element may be a diode having other structure. Here, a PN junction diode including semiconductor layers 44 and 45 is provided between the first conductive layer and the organic compound layer. One of the semiconductor layers 44 and 45 is an N-type semiconductor while the other is a P-type semiconductor. Thus, selectivity of a memory cell and margin of reading and writing can be enhanced by providing the rectifying element.

As described above, an organic memory element shown in this embodiment mode has a simple structure in which an organic compound layer is provided between a pair of conductive layers; therefore, a manufacturing process thereof is simple and a semiconductor device having a highly integrated organic memory element can be provided at low cost. According to the above structure, data can be also written (written once, read many) except when manufacturing the organic memory element; therefore, data can be appropriately written when a user requires. Further, the organic memory according to the invention is a nonvolatile memory; therefore, an electric battery for maintaining data is not required to be incorporated, and a small-sized, thin, and lightweight semiconductor device can be provided. According to the above organic memory, data cannot be rewritten though data can be written (written once, read many). Accordingly, counterfeits can be prevented and a semiconductor device with ensured security can be provided by using the organic memory.

Next, an operation of writing data to the organic memory is explained. Writing data is conducted by optical action or electric action. First, writing data by electric action is explained (refer to FIG. 13). Writing is conducted by changing electric characteristics of a memory cell, and an initial state (condition without electric action) of the memory cell is data "0" and a state of changing electric characteristics is data "1" in this embodiment mode.

In the case of writing data "1" to the memory cell 21, the memory cell 21 is selected first by decoders 23 and 24 and a selector 25. Concretely, a predetermined voltage V2 is applied to a word line W3 connected to the memory cell 21 by the decoder 24. A bit line B3 connected to the memory cell 21 is connected to a reading/writing circuit 26 by the decoder 23 and the selector 25. Then, a writing voltage V1 is outputted from the reading/writing circuit 26 to the bit line B3. Thus, voltage Vw=V1−V2 is applied between a first conductive layer and a second conductive layer included in the memory cell 21. By selecting electric potential Vw appropriately, an organic compound layer 29 provided between the conductive layers is changed physically or electrically to write data "1". Concretely, in a reading operation voltage, electric resistance between the first conductive layer and second conductive layer in the state of data "1" may be changed so as to be drastically lowered compared with electric resistance in the state of data "0". For example, the voltage may be appropriately selected from the range of (V1, V2)=(0 V, 5 V to 15 V) or (3 V to 5 V, −12 V to −2 V). The electric potential Vw may be 5V to 15V or −5V to −15V. In this case, the distance between the pair of conductive layers provided so as to interpose the organic compound layer changes in some cases.

A non-selected word line and a non-selected bit line are controlled so that data "1" is not written to the memory cell which is to be connected to the non-selected word line and the non-selected bit line. For example, the non-selected word line and the non-selected bit line may be in a floating state. Characteristics which can ensure selectivity such as diode characteristics are required between the first conductive layer and second conductive layer included in the memory cell.

On the other hand, in the case of writing data "0" to the memory cell 21, all that is required is that electric action is not applied to the memory cell 21. In circuit operation, for example, although the memory cell 21 is selected by the decoders 23 and 24 and the selector 25 in the same way as the case of writing data "1", an output electric potential from the reading/writing circuit 26 to the bit line B3 may be set to be equivalent to an electric potential of a selected word line W3 or an electric potential of a non-selected word line, and a voltage (for example, −5 V to 5 V) may be applied between the first conductive layer and second conductive layer included in the memory cell 21 to such a degree that the electric characteristics of the memory cell 21 is not changed.

Next, writing data by optical action is explained (refer to FIGS. 9B and 9C). In this case, an organic compound layer 29 included in an organic memory element is irradiated with laser light from a conductive layer side having a light transmitting property (second conductive layer 28 here). Here, the organic compound layer 29 included in an organic memory element in a desired portion is selectively irradiated with laser light to destroy the organic compound layer 29. The destroyed organic compound layer is insulated; therefore, the resistance thereof is increased compared with the resistance of other organic memory element. Data is written by utilizing the phenomenon that electric resistance between two conductive layers provided so as to interpose the organic compound layer 29 is changed by laser light irradiation. For example, in the case where an organic memory element including an organic compound layer which is not irradiated with laser light is made to be data "0", an organic compound layer included in an organic memory element in a desired portion is selectively irradiated with laser light and destroyed to heighten electric resistance in the case of writing data "1".

In the case of using a conjugated polymer doped with a compound (photo acid generator) which generates acid by absorbing light as the organic compound layer 29, conductivity increases only the portion of being irradiated with laser light and a portion of not being irradiated with laser light has no conductivity when the organic compound layer is irradiated with laser light. Therefore, data is written by utilizing the phenomenon that electric resistance of an organic memory element is changed by irradiating an organic compound layer included in the organic memory element in a desired portion with laser light. For example, in the case where an organic compound layer which is not irradiated with laser light is made to be data "0", an organic compound layer in a desired portion is selectively irradiated with laser light to heighten conductivity in the case of writing data "1".

In the case of laser light irradiation, the change of electric resistance of the organic compound layer 29 included in an organic memory element depends on the size of the memory cell 21; however, the change is realized by laser light irradiation narrowed in a diameter of micrometer size. For example, when a laser beam having a diameter of 1 μm passes at a linear velocity of 10 m/sec, the period of irradiating a layer including an organic compound included in one memory cell 21 with laser light is 100 nsec. In order to change the phase within time as short as 100 nsec, the laser power is preferably 10 mW and the power density is preferably 10 kW/mm$^2$. When the organic compound layer is selectively irradiated with laser light, it is preferable to use a pulsed oscillation laser irradiation apparatus.

Figure 12:
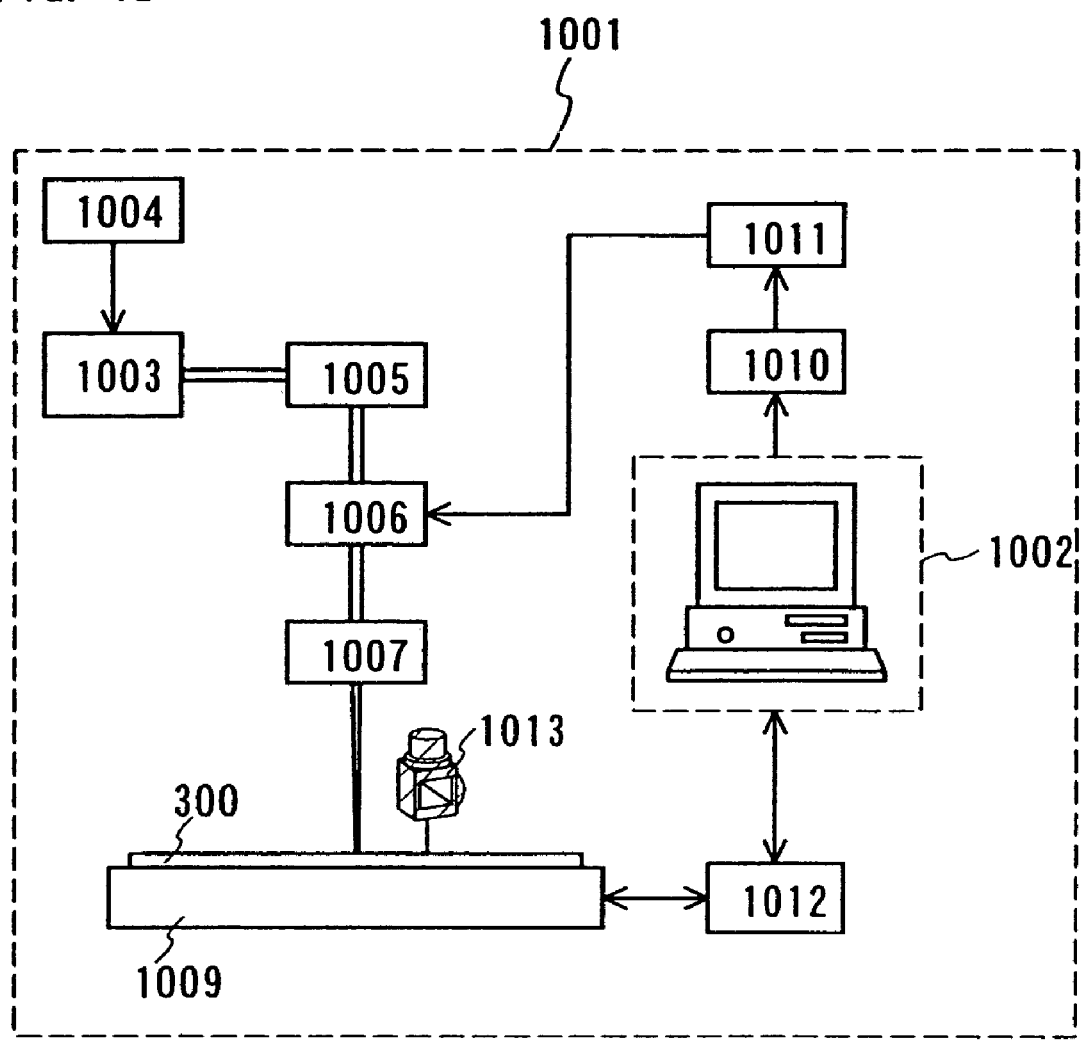
FIG. 12 is a view showing one example of a laser irradiation apparatus according to the invention.

Here, one example of a laser irradiation apparatus is explained with reference to FIG. 12. A laser irradiation apparatus 1001 is provided with a personal computer (hereinafter, referred to as PC 1002) for conducting various controls when laser light is emitted; a laser oscillator 1003 for emitting laser light; a power supply 1004 of the laser oscillator 1003; an optical system (ND filter) 1005 for attenuating the laser light; an Acousto-Optic Modulator (AOM) 1006 for modulating the intensity of the laser light; an optical system 1007 including a lens for shrinking the cross section of the laser light, a mirror for changing a light path, and the like; a movement mechanism 1009 having a X axis stage and a Y axis stage; a D/A converter 1010 for converting control data outputted from the PC from a digital one to an analog one; a driver 1011 for controlling the Acousto-Optic Modulator 1006 depending on the analog voltage outputted from the D/A converter; a driver 1012 for outputting a driving signal for driving the movement mechanism 1009; and an autofocusing mechanism 1013 for focusing laser light on an object to be irradiated (FIG. 12).

A laser oscillator which can oscillate ultraviolet light, visible light, or infrared light can be used as the laser oscillator 1003. An excimer laser oscillator such as KrF, ArF, XeCl, or Xe; a gas laser oscillator such as He, He—Cd, Ar, He—Ne, or HF; a solid laser oscillator using a crystal such as YAC; GdVO$_4$, YVO$_4$, YLF, or YAlO$_3$ doped with Cr, Nd, Er, Ho, Ce, Co, Ti, or Tm; or a semiconductor laser oscillator such as GaN, GaAs, GaAlAs, or InGaAsP can be used as the laser oscillator. Note that a fundamental wave or a second harmonic to a fifth harmonic are preferably applied to the solid laser oscillator.

Next, an irradiation method using the laser irradiation apparatus is described. When the movement mechanism 1009 is equipped with a substrate 30 provided with an organic compound layer 29, the PC 1002 detects a position of the organic compound layer 29 which is to be irradiated with laser light by a camera which is not shown in the drawing. Then, the PC 1002 generates movement data for moving the movement mechanism 1009 based on the detected position data.

Thereafter, the PC 1002 controls the amount of light which is to be emitted from the Acousto-Optic Modulator 1006 through the driver 1011, and accordingly, laser light emitted from the laser oscillator 1003 is attenuated by the optical system 1005. Then, the amount of light is controlled so that a predetermined amount of light is obtained using the Acousto-Optic Modulator 1006. On the other hand, the light path and the shape of beam spot of the laser light outputted from the Acousto-Optic Modulator 1006 are changed with the optical system 1007 and the laser light converges on the lens. Then, the substrate is irradiated with the laser light.

At this time, the movement mechanism 1009 is controlled to move toward an X direction and a Y direction in accordance with the movement data generated by the PC 1002. As a result, a predetermined position is irradiated with the laser light, and the light energy density of the laser light is converted to the heat energy. Thus, the organic compound layer provided over the substrate 30 can be selectively irradiated with laser light. It is to be noted that laser light irradiation is conducted by moving the movement mechanism 1009; however, laser light may be moved to a X direction and a Y direction by adjusting the optical system 1007.

As described above, a semiconductor device can be easily manufactured in large amount by using the above structure according to the invention for writing data with laser light irradiation. Hence, an inexpensive semiconductor device can be provided.

Figure 10A:
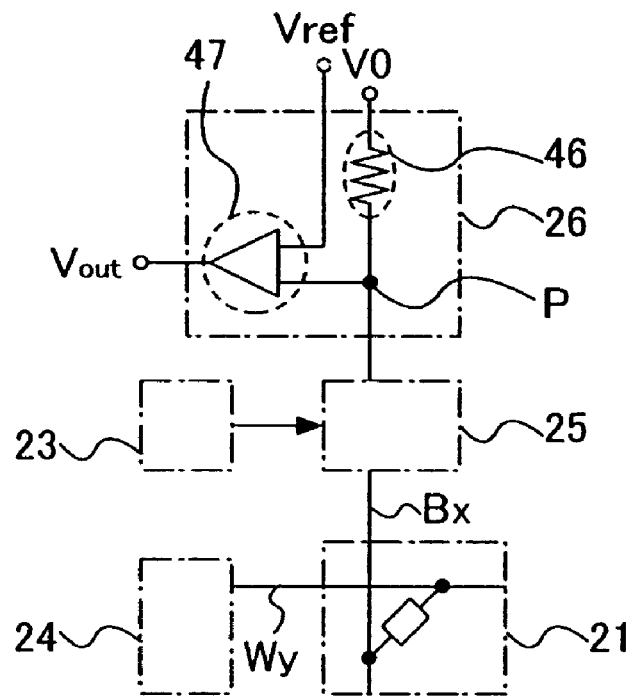
FIGS. 10A and 10B are explanatory views of a semiconductor device and a driving method thereof according to the invention.
Figure 10B:
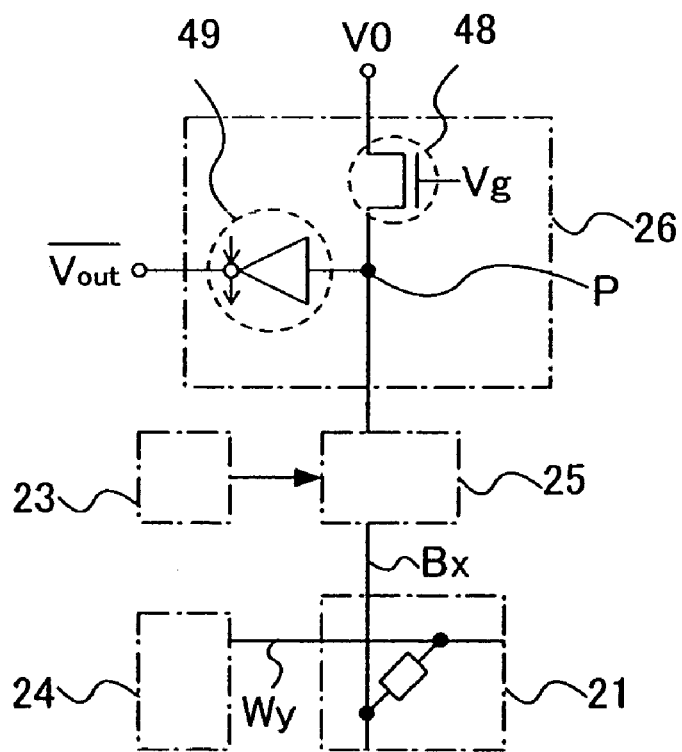

Subsequently, an operation of reading data from an organic memory is explained (refer to FIGS. 13 and 10). Reading data is carried out by using electronic characteristics between a first conductive layer and a second conductive layer included in a memory cell, which are different between a memory cell with data "0" and a memory cell with data "1". For example, a reading method utilizing the difference in electric resistance is explained, where the effective electric resistance between a first conductive layer and a second conductive layer included in a memory cell (herein after also referred to as electric residence of memory cell) with data "0" is R0 at a reading voltage, and the electric resistance of a memory cell with data "1" is R1 (R1<<R0) at a reading voltage. As for a reading/writing circuit, for example, a circuit 26 using a resistance element 46 and a differential amplifier 47 shown in FIG. 10A can be conceivable as a structure of a reading portion. The resistance element 46 has a resistance value Rr (R1<Rr<R0). A transistor 48 may be used instead of the resistance element 46 and a clocked inverter 49 can be used instead of the differential amplifier (FIG. 10B). A signal or an inverted signal which is Hi when reading is conducted and Lo when reading is not conducted is inputted into the clocked inverter 49. Obviously, a circuit configuration is not limited to FIGS. 10A and 10B.

In the case of reading data from the memory cell 21, the memory cell 21 is selected first by the decoders 23 and 24 and the selector 25. Concretely, a predetermined voltage Vy is applied to a word line Wy connected to the memory cell 21 by the decoder 24. A bit line Bx connected to the memory cell 21 is connected to a terminal P of the reading/writing circuit 26 by the decoder 23 and the selector 25. Accordingly, the electric potential Vp of the terminal P is a value determined by dividing Vy and V0 by the resistance element 46 (resistance value: Rr) and the memory cell 21 (resistance value: R0 or R1). Therefore, the equation Vp0=Vy+(V0−Vy)*R0/(R0+Rr) holds in the case where the memory cell 21 has data "0". Alternatively, the equation Vp1=Vy+(V0−Vy)*R1/(R1+Rr) holds in the case where the memory cell 21 has data "1". As a result, by selecting Vref so as to be between Vp0 and Vp1 in FIG. 10A or by selecting the change point of the clocked inverter so as to be between Vp0 and Vp1 in FIG. 10B, output electric potential Vout of Lo/Hi (or Hi/Lo) is outputted in accordance with data "0"/"1" so that reading can be conducted.

For example, assume that the differential amplifier is made to operate at Vdd=3 V, and Vy, V0, and Vref are 0 V, 3 V, and 1.5 V, respectively. On the condition of R0/Rr=Rr/R1=9, Hi is outputted as Vout in accordance with Vp0=2.7 V when a memory cell has data "0", or Lo is outputted as Vout in accordance with Vp1=0.3 V when a memory cell has data "1". In this way, reading from a memory cell can be conducted.

According to the above method, the state of electric resistance of an organic memory element is read in a voltage value utilizing the difference in a resistance value and resistance division. Obviously, the reading method is not limited to this method. For example, reading may be conducted utilizing the difference in a current value other than utilizing the difference in electric resistance. In the case where electric characteristics of the memory cell have different diode characteristics in a threshold voltage in the case of data "0" and data "1", reading may be conducted utilizing the difference in a threshold voltage.

Thus, the structure of an organic memory element can be simply provided according to this embodiment mode; therefore, a semiconductor device provided with an organic memory element having a minute structure, namely having large capacity, can be provided at low cost. Further, as for the above organic memory, data cannot be rewritten though data can be written once and read many; therefore, counterfeits or the like can be effectively prevented by the semiconductor device provided with the above organic memory.

This embodiment mode can be freely combined with the above embodiment mode.

Embodiment Mode 3

As described above, a memory is an indispensable component of a semiconductor device according to the present invention. In this embodiment mode, a memory which has different structure from that of the above Embodiment Mode 2 is explained with reference to FIGS. 11A to 11C.

Figure 11A:
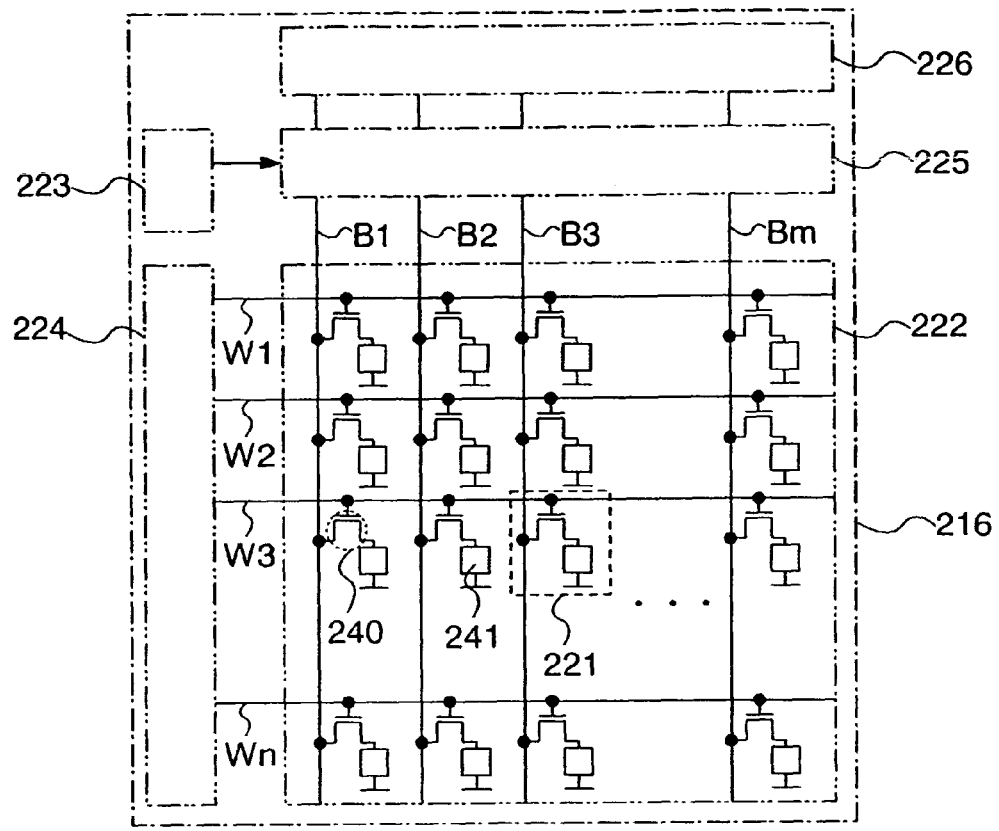
FIGS. 11A to 11C are explanatory views of a semiconductor device and a driving method thereof according to the invention.

A memory 216 includes a memory cell array 222 provided with memory cells 221 in a matrix, decoders 223 and 224, a selector 225, and a reading/writing circuit 226 in FIG. 11A. The structure of the memory 216 here is one example, and other circuits such as a sense amplifier, an output circuit, a buffer, and the like may be included.

The memory cell 221 includes a first wiring connected to a bit line Bx ($1 \leq x \leq m$), a second wiring connected to a word line Wy ($1 \leq y \leq n$), a transistor 240, and a memory element 241. The memory element 241 has a structure in which an organic compound layer is interposed between a pair of conductive layers. A gate electrode of the transistor is connected to the word line, one of a source electrode and a drain electrode is connected to the bit line, and the other of the source electrode and the drain electrode is connected to one of two terminals included in the memory element. The other of the two terminals included in the memory element is connected to a common electrode (electric potential: Vcom). That is, the structure of the organic memory shown in FIGS. 11A to 11C corresponds to the structure of the memory element (active matrix type) of a layer 402 including a plurality of memory elements in FIGS. 3 and 5B or a layer 502 including a plurality of memory elements in FIG. 8.

For example, as for a semiconductor device shown in FIG. 3, in the case of writing data by optical action, a second conductive layer 369 is formed from a material having a light-transmitting property such as indium tin oxide (ITO) or formed so as to have a thickness through which light is transmitted. At least one selected from insulating layers 342, 343, and 370 is preferably formed from a light shielding material so that light is not emitted to a field effect transistor. In the case of providing a conductive layer serving as an antenna as shown in FIGS. 4A to 8, an opening window is preferably provided in a portion of the memory element in which data is to be written so that the memory element can be irradiated with light.

On the other hand, in the case of writing data by electric action, a material for first conductive layers 361 to 364 and the second conductive layer 369 is not especially limited.

Organic compound layers 365 to 368 are explained in the above embodiment modes, and a structure of a single layer or a stacked layer formed from any of materials described above can be used.

In the case of using any of organic compound materials as the organic compound layer, writing data is conducted by optical action such as laser light or electric action. In the case of using a conjugated polymer material doped with a photo acid generator, writing data is conducted by optical action. Reading data is conducted by electric action in any cases without depending on the material of the organic compound layer.

Figure 11B:
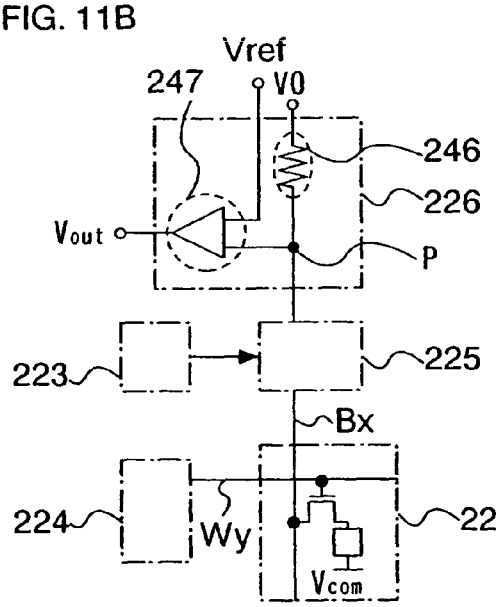
Figure 11C:
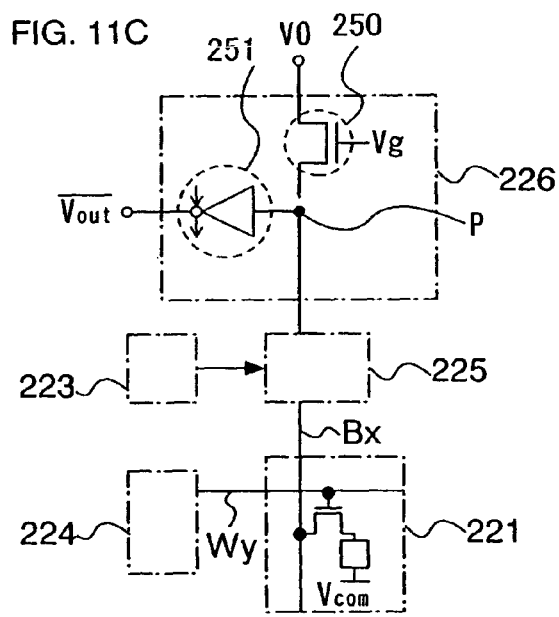

Next, an operation of writing data, to the memory 216 is explained (refer to FIGS. 11A to 11C).

First, an operation of writing data by electric action is explained. Writing is conducted by changing electric characteristics of the memory cell, and an initial state (state without electric action) of the memory cell is data "0" and a state in which electric characteristics have been changed is data "1".

Here, a case of writing data to the memory cell 221 in n-th row and m-th column is explained. In the case of writing data "1" to the memory cell 221, the memory cell 221 is selected first by the decoders 223 and 224 and the selector 225. Concretely, a predetermined voltage V22 is applied to a word line Wn connected to the memory cell 221 by the decoder 224. In addition, a bit line Bm connected to the memory cell 221 is connected to a reading/writing circuit 226 by the decoder 223 and the selector 225. Then, a writing voltage V21 is outputted from the reading/writing circuit 226 to the bit line Bm.

In this way, a transistor 240 included in the memory cell is turned on, and a memory element 241 is electrically connected to a common electrode and a bit line to apply voltage of approximately Vw=Vcom−V21. An organic compound layer 29 provided between the conductive layers is changed physically or electrically by appropriately selecting electric potential Vw so that writing of data "1" is conducted. Concretely, in a reading operation voltage, electric resistance between the first conductive layer and second conductive layer in the state of data "1" may be changed so as to be drastically lowered compared with electric resistance in the state of data "0", or simply, short circuit may be established. The electric potential may be appropriately selected from the range of (V21, V22, Vcom)=(5 V to 15 V, 5 V to 15 V, 0 V) or (−12 V to 0 V, −12 V to 0 V, 3 V to 5 V). The electric potential Vw may be 5 V to 15 V or −5 V to −15 V. In this case, the distance between the pair of conductive layers provided so as to interpose the organic compound layer changes in some cases.

A non-selected word line and a non-selected bit line are controlled so that data "1" is not written to a memory cell which is to be connected to the non-selected word line and the non-selected bit line. Concretely, an electric potential (for example, 0 V) for turning off the transistor in the memory cell which is to be connected may be applied to the non-selected word line, and the non-selected bit line may be in a floating state or an electric potential equivalent to Vcom may be applied to the non-selected bit line.

On the other hand, in the case of writing data "0" to the memory cell 221, all that is required is that electric action is not applied to the memory cell 221. In circuit operation, for example, although the memory cell 221 is selected by the decoders 223 and 224 and the selector 225 in the same way as the case of writing data "1", an output electric potential from the reading/writing circuit 226 to the bit line Bm is set to be equivalent to Vcom or the bit line Bm is set to be in a floating state. As a result, a low voltage (for example, −5 V to 5 V) or no voltage is applied to the memory element 241; therefore, electric characteristics do not change and writing data "0" is realized.

Next, an operation of writing data by optical action is explained. In this case, an organic compound layer is irradiated with laser light from a second conductive layer side having a light-transmitting property using a laser irradiation apparatus 232.

When an organic compound material is used for the organic compound layer, the organic compound layer is oxidized or carbonized to be insulated by laser light irradiation. Then, the resistance value of a memory element 241 which is irradiated with laser light increases, whereas the resistance value of a memory element 241 which is not irradiated with laser light does not change. In the case of using a conjugated polymer material doped with a photo acid generator, conductivity is imparted to the organic compound layer by laser light irradiation. That is, conductivity is imparted to the memory element 241 which is irradiated with laser light, whereas conductivity is not imparted to the memory element 241 which is not irradiated with laser light.

Subsequently, an operation of reading data by electric action is explained. Reading data is carried out by using electronic characteristics of a memory element 241, which are different between a memory cell with data "0" and a memory cell with data "1". For example, a reading method by utilizing the difference in electric resistance is explained, provided that electric resistance of the memory element included in the memory cell with data "0" is R0 in a reading voltage, and electric resistance of the memory element included in the memory cell with data "1" is R1 (R1<<R0) in a reading voltage. As for a reading/writing circuit, for example, a circuit 226 using a resistance element 246 and a differential amplifier 247 shown in FIG. 11B can be conceivable as a structure of a reading portion. The resistance element has a resistance value Rr (R1<Rr<R0). A transistor 250 may be used instead of the resistance element 246 and a clocked inverter 251 can be used instead Of the differential amplifier (FIG. 11C). Obviously, a circuit configuration is not limited to FIGS. 11A to 11C.

In the case of reading data from the memory cell 221 in n-th row and m-th column, the memory cell 221 is selected first by the decoders 223 and 224 and the selector 225. Concretely, a predetermined voltage V24 is applied to a word line Wn connected to the memory cell 221 by the decoder 224 to turn on the transistor 240. In addition, a bit line Bm connected to the memory cell 221 is connected to a terminal P of the reading/writing circuit 226 by the decoder 223 and the selector 225. Accordingly, the electric potential Vp of the terminal P is a value determined by dividing Vcom and V0 by the resistance element 246 (resistance value: Rr) and the memory element 241 (resistance value: R0 or R1). Therefore, the equation Vp0=Vcom+(V0−Vcom)*R0/(R0+Rr) holds in the case where the memory cell 221 has data "0". Alternatively, the equation Vp1=Vcom+(V0−Vcom)*R1/(R1+Rr) holds in the case where the memory cell 221 has data "1". As a result, by selecting Vref so as to be between Vp0 and Vp1 in FIG. 11B or by selecting the change point of the clocked inverter so as to be between Vp0 and Vp1 in FIG. 11C, Lo/Hi (or Hi/Lo) of output electric potential Vout is outputted in accordance with data "0"/"1" so that reading can be conducted.

For example, the differential amplifier is operated at Vdd=3 V, and Vcom, V0, and Vref are 0 V, 3 V, and 1.5 V, respectively. On the condition that the equation R0/Rr=Rr/R1=9 holds and on-resistance of the transistor 240 can be ignored, Hi is outputted as Vout in accordance with Vp0=2.7 V when a memory cell has data "0", or Lo is outputted as Vout in accordance with Vp1=0.3 V when a memory cell has data "1". In this way, reading from a memory cell can be conducted.

In accordance with the above method, reading is conducted by a voltage value utilizing the difference in a resistance value of the memory element 241 and resistance division. Obviously, the reading method is not limited to this method. For example, reading may be conducted utilizing the difference in a current value other than the method utilizing the difference in electric resistance. In the case where electric characteristics of the memory cell have different diode characteristics in threshold voltage in the case of data "0" and data "1", reading may be carried out by using difference in a threshold voltage.

Further, as for the organic memory as described above, data cannot be rewritten though data can be written once and read many; therefore, counterfeits or the like can be effectively prevented by the semiconductor device provided with the above organic memory.

This embodiment mode can be freely combined with the above embodiment modes.

Embodiment Mode 4

In this embodiment mode, a communication procedure using a semiconductor device according to the present invention as a wireless chip 3060 is briefly explained hereinafter (refer to FIG. 14).

First, an antenna 3050 included in the wireless chip 3060 receives an electric wave from a reader/writer 3070. Then, electromotive force is generated by resonance action in a power generation means 3030. An IC chip 3040 included in the wireless chip 3060 is started, and data in a memory means 3010 is converted to a signal by a control means 3020.

Next, a signal is sent from the antenna 3050 included in the wireless chip 3060. Then, the reader/writer 3070 receives a transmitted signal by the antenna included in the reader/writer 3070. The received signal is transmitted to a data processing system through a controller included in the reader/writer 3070, and data processing is conducted using software. In the above communication procedure, a coiled antenna is used and an electromagnetic induction method using magnetic flux generated by induction between a coil of a wireless chip and a coil of a reader/writer is illustrated. However, an electric wave method using an electric wave of a microwave band may be adopted.

As for the wireless chip in this embodiment mode, a passive type for supplying a power supply voltage to an element formation layer by an electric wave without mounting a power supply (buttery) or an active type for supplying a power supply voltage to an element formation layer with mounting a power supply (buttery) instead of an antenna may be used, or a power supply voltage may be supplied by an electric wave and a power supply.

The wireless chip 3060 has advantages that non-contact communication is possible; multiple reading is possible; writing data is possible; processing into various shapes is possible; directivity is wide and a wide recognition range is provided depending on the selected frequency; and the like. The wireless chip 3060, in non-contact wireless communication, can be applied to an IC tag which can identify individual information of a person or a thing, an adhesive label which is enabled to be attached to an object by label processing, a wristband for an event or an amusement, or the like. In addition, the wireless chip 3060 may be processed with a resin material and may be directly fixed to a metal obstructing wireless communication. Further, the wireless chip 3060 can be utilized for an operation of a system such as an entering-leaving management system or a checkout system.

Figure 15A:
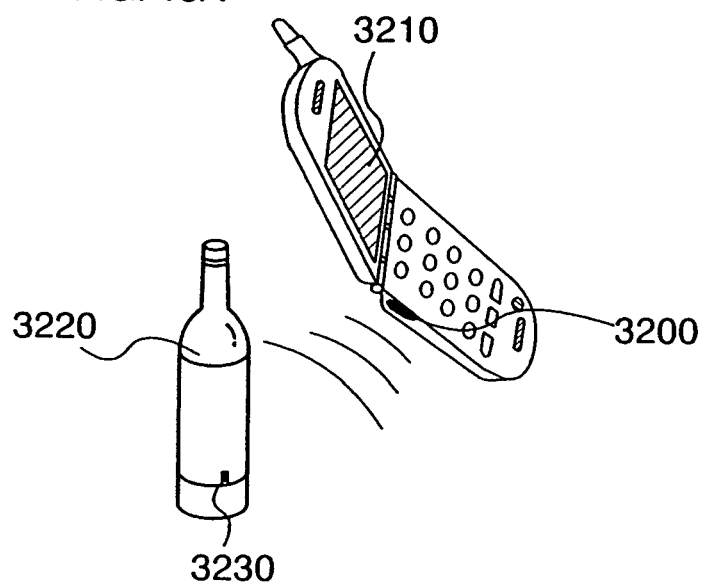
FIGS. 15A and 15B are explanatory views of one example of a usage mode of a semiconductor device according to the invention.
Figure 15B:
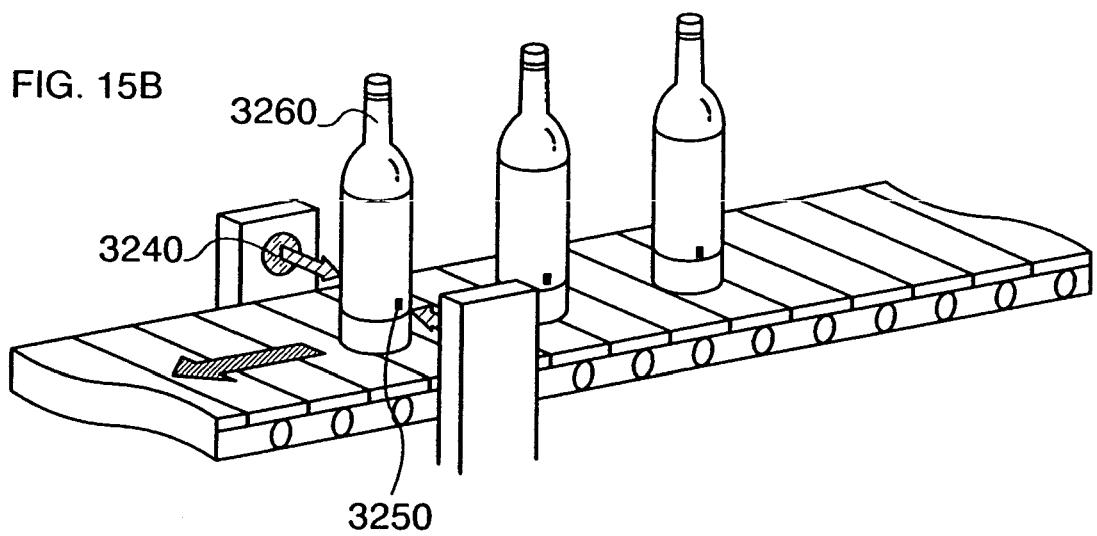

Next, one mode of the actual use of the wireless chip practically is explained. A reader/writer 3200 is provided on the side of a portable terminal including a display portion 3210, and a wireless chip 3230 is provided on the side of an article 3220 (refer to FIG. 15A). When the reader/writer 3200 is held against the wireless chip 3230 included in the article 3220, information relating to a product, such as a raw material and a place of origin of the article, a test result in each production process, a history of distribution process, or further, description of the product is displayed in the display portion 3210. In addition, a product 3260 can be inspected by using a reader/writer 3240 and a wireless chip 3250 provided on the product 3260 when the product 3260 is transported with a belt conveyor (refer to FIG. 15B). In this manner, information can be easily obtained, and a high function and a high added value are realized by utilizing a wireless chip for a system.

This embodiment mode can be freely combined with the above embodiment modes.

Embodiment Mode 5

In the case of integrating a semiconductor device according to the present invention with an organic memory, it is preferable to have features as follows.

A reading period is preferably 1 nsec to 100 μsec to be operated in operating frequency (typically, 10 kHz to 1 MHz) of a logic circuit in a wireless chip. In this invention, a reading operation is not required to make characteristics of an organic compound change; therefore, a reading period of 100 μsec or less can be realized.

Obviously, it is preferable that a writing period per bit is shorter; however, writing operation is not so much conducted, and a permissible range is 100 nsec/bit to 10 msec/bit depending on the usage. For example, in the case of writing of 256 bit, 2.56 seconds are required when the writing period per bit is 10 msec/bit. In this invention, characteristics of an organic compound are required to be made to change in a writing period and a writing operation requires more time than a reading operation; however, a writing period of 10 msec or less can be realized. A writing period can be shortened by heightening a writing voltage or parallelizing writing.

A memory capacity of the memory is preferably approximately 64 bit to 64 Mbit. In the case where only UID (Unique Identifier) and other little information are stored in a wireless chip and a main data is stored in other file server as a usage mode of the wireless chip, a memory capacity of the memory is preferably approximately 64 bit to 8 kbit. In the case of storing data such as history information in a wireless chip, the memory capacity of the memory is preferably larger, and approximately 8 kbit to 64 Mbit is preferable.

The communication distance of a wireless chip closely relates to power consumption of a chip, and in general, a long communication distance can be realized when power consumption is small. In particular, power consumption is preferably 1 mW or less in reading operation. In writing operation, there is a case where a communication distance may be short according to the usage, and power consumption which is larger than that of reading operation is permissive, and for example, power consumption is preferably 5 mW or less. In this invention, power consumption of an organic memory of 10 μW to 1 mW can be realized in reading operation, although it depends obviously on memory capacity or operating frequency. Power consumption of writing operation increases since a higher voltage than that of reading operation is required. Power consumption of 50 μW to 5 mW can be realized in writing operation, although it also depends on memory capacity or operating frequency.

The area of the memory cell is preferably small, and 100 nm square to 30 μm square can be realized. In a passive type having no transistor in a memory cell, the area of the memory cell is determined depending on the width of wirings, and a small-sized memory cell having approximately a minimum processing dimension can be realized. In an active matrix type having one transistor in a memory cell, a small-sized area of the memory cell compared with a DRAM having a capacitor element or a SRAM using a plurality of transistors can be realized although the area of disposing a transistor is required. The area of a memory cell array of 1 kbit memory can be 1 mm square or less by realizing the area of the memory cell of 30 um square or less. The area of a memory cell array of 64 Mbit memory can be 1 mm square or less by realizing the area of the memory cell of approximately 100 nm square. As a result, the area of a chip can be made to be small.

These features of an organic memory depend on characteristics of a memory element. As characteristics of the memory element, a voltage required for electrical writing is preferably a low voltage within the range that writing is not conducted in reading, and may be 5 V to 15 V, more preferably, 5 V to 10 V. A current value flowing in the memory element in writing is preferably approximately 1 nA to 30 μA. According to such values, power consumption can be lowered and the area of a chip can be reduced by miniaturizing a boosting circuit. A period required for changing characteristics by applying voltage to the memory element is preferably 100 nsec to 10 msec corresponding to the writing period of a bit of the organic memory. The area of the memory element is preferably 100 nm square to 10 Mm square. According to such values, the area of the chip can be reduced by realizing a small-sized memory cell.

This embodiment mode can be freely combined with the above embodiment mode.

Embodiment Mode 6

The usage of a semiconductor device according to the present invention is wide-ranging. For example, the semiconductor device can be used for an electronic apparatus in which information is stored and displayed. Concrete examples of the above electronic apparatus are shown in FIGS. 18A to 18C.

Figure 18A:
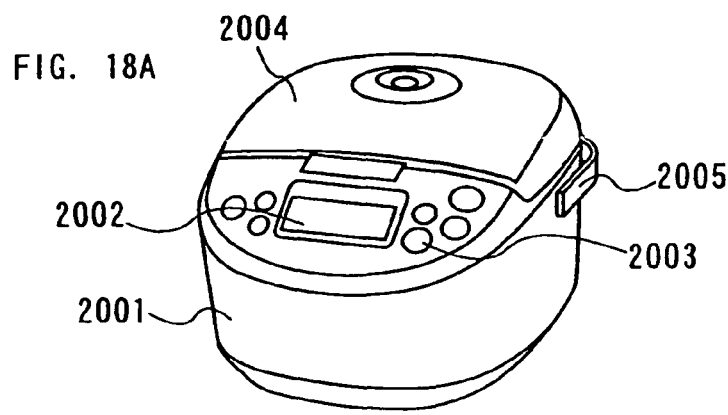
FIGS. 18A to 18C are explanatory views of one example of a usage mode of a semiconductor device according to the invention.

FIG. 18A shows a rice cooker, which includes a chassis 2001, a display portion 2002, an operation button 2003, a lid 2004, a handle 2005, and the like. Various data can be stored and the data can be displayed using the display portion 2002 by providing a semiconductor device illustrated in the embodiment modes described above for a rice cooker. For example, information one wants to know can be easily searched by operating the operation button 2003 by a user with a recipe (the amount of water, the amount of rice, or the like) for making white rice, rice porridge, rice with edible wild plants, or the like stored in the rice cooker in advance. Moreover, data can be written (written once, read many) by a user as for, for example, the softness or hardness of rice or the like to suit the preference of the user.

Figure 18B:
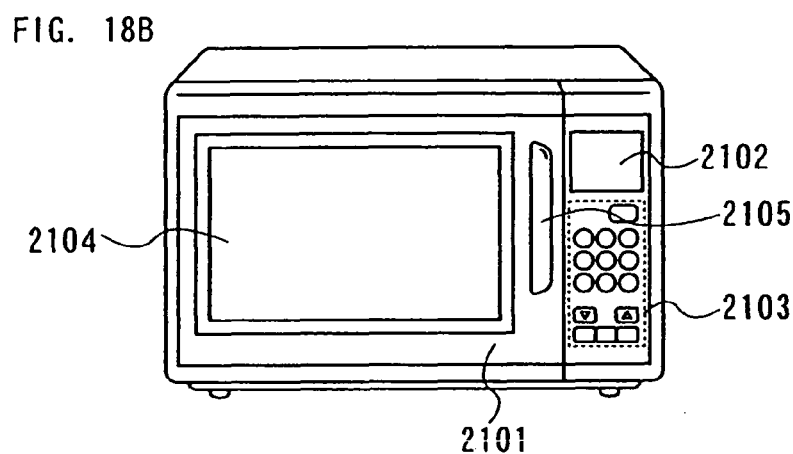

FIG. 18B shows a microwave oven, which includes a chassis 2101, a display portion 2102, an operation button 2103, a window 2104, a handle 2105, and the like. Various data can be stored and the data can be displayed using the display portion 2102 by providing a semiconductor device illustrated in the embodiment modes described above for a microwave oven. For example, information one wants to know can be easily searched by operating the operation button 2103 by a user with a recipe for various foods, the heating time and thawing time of the material thereof, or the like stored in the microwave oven in advance. Moreover, a user's original recipe or the like which is not stored as data can be written as data.

Figure 18C:
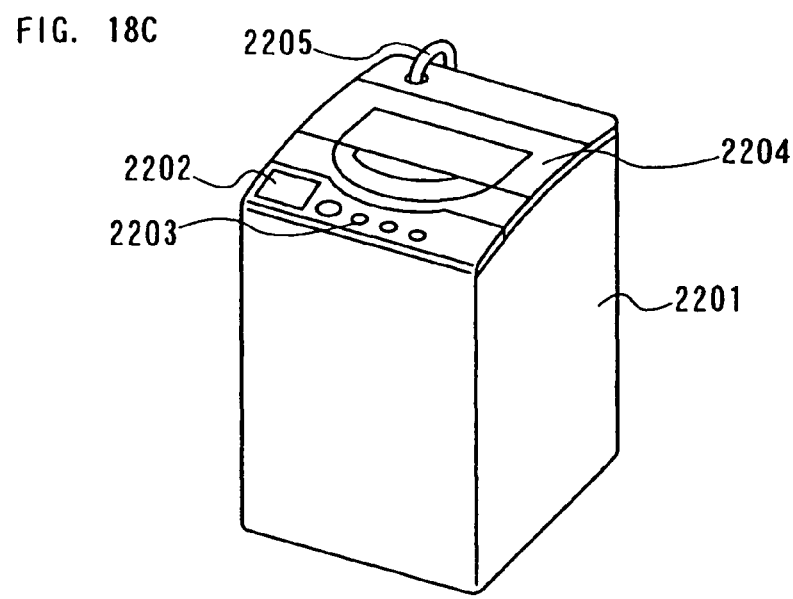
Figure 19A:
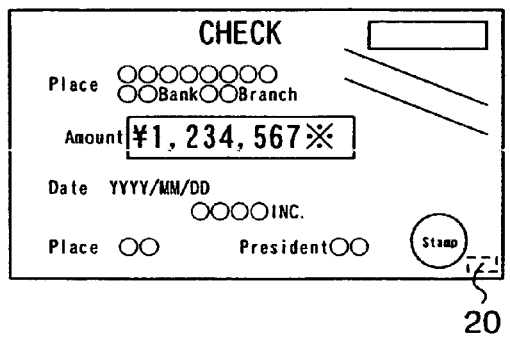
FIGS. 19A to 19H are explanatory views of one example of a usage mode of a semiconductor device according to the invention.
Figure 19B:
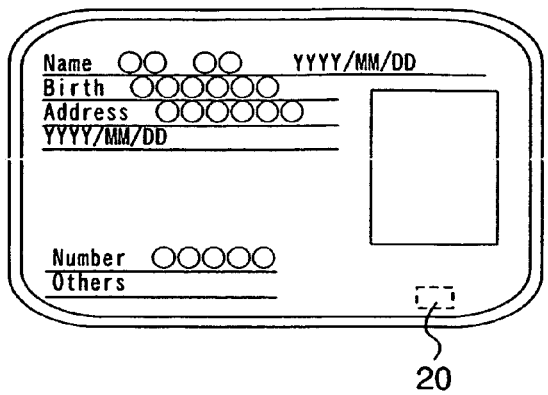
Figure 19C:
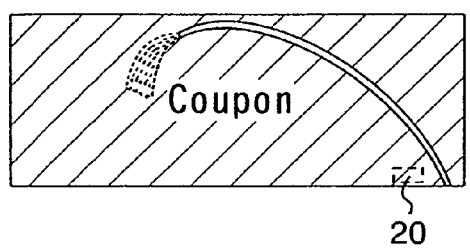
Figure 19D:
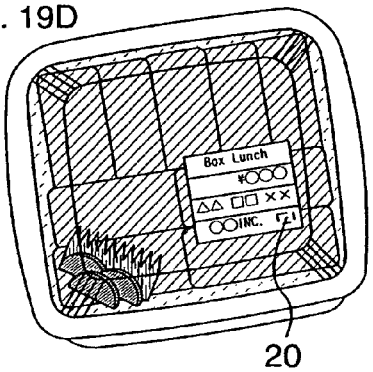
Figure 19E:
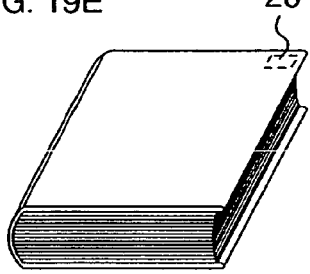
Figure 19F:
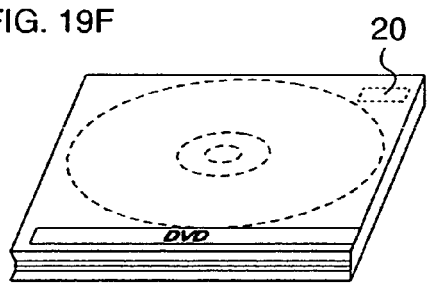
Figure 19G:
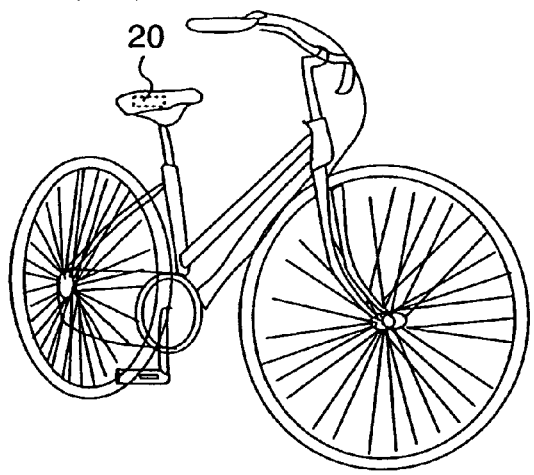
Figure 19H:
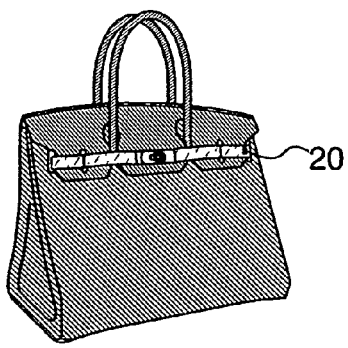

FIG. 18C shows a washing machine, which includes a chassis 2201, a display portion 2202, an operation key 2203, a lid 2204, a hose 2205, and the like. Various data can be stored and the data can be displayed using the display portion 2202 by providing a semiconductor device illustrated in the embodiment modes described above for a washing machine. For example, information one wants to know can be easily searched by operating the operation button 2203 by a user with a washing method, the amount of water to the amount of garments, the amount of detergent, and the like stored in the washing machine in advance. Moreover, a washing method can be written as data by a user to suit the preference of the user.

Figure 20:
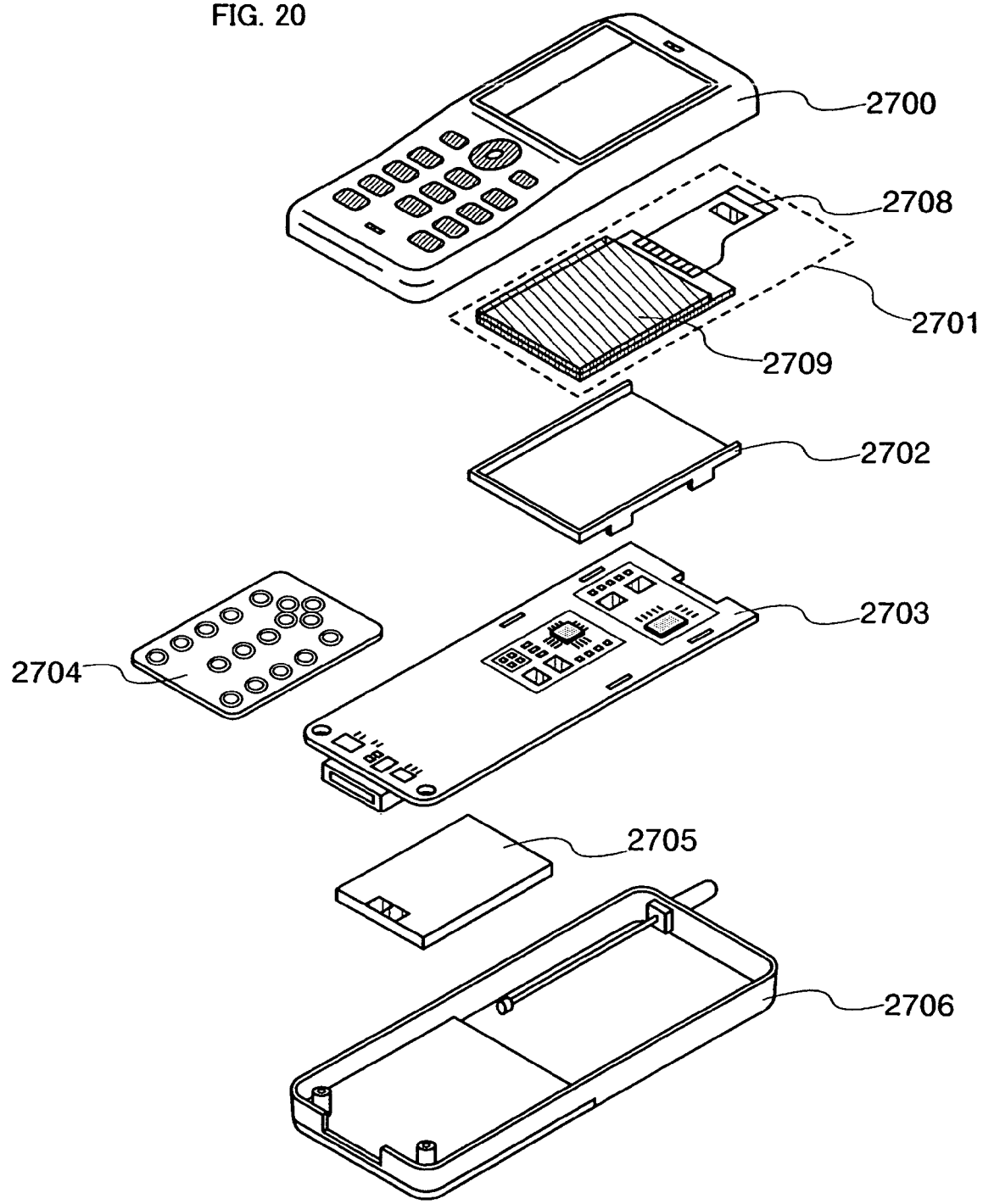
FIG. 20 is an explanatory view of one example of a usage mode of a semiconductor device according to the invention.

The application of a semiconductor device according to the invention is not limited to that shown in FIGS. 18A to 18C, and the semiconductor device can be utilized for a television receiver; a handheld terminal such as a cellular phone; a digital camera; a video camera, a navigation system, or the like. The case of utilizing a semiconductor device according to the invention for a cellular phone is explained with reference to FIG. 20. The cellular phone includes chassis 2700 and 2706, a panel 2701, a housing 2702, a printed wiring board 2703, an operation button 2704, a buttery 2705, and the like. The panel 2701 is incorporated into the housing 2702 so as to be freely detached/attached, and the housing 2702 is fitted into the printed wiring board 2703. The shape and measurement of the housing 2702 can be appropriately changed depending on an electronic apparatus into which the panel 2701 is incorporated. A plurality of semiconductor devices which are packaged are mounted on the printed wiring board 2703, and the semiconductor device according to the invention can be used as one of the plurality of semiconductor devices. Each of the plurality of semiconductor devices mounted on the printed wiring board 2703 serves as any one of a controller, a central processing unit (CPU), a memory, a power supply circuit, a audio processing circuit, a sending/receiving circuit, and the like.

The panel 2701 is integrated with the printed wiring board 2703 through a connection film 2708. The panel 2701, the housing 2702, and the printed wiring board 2703 described above are placed inside the chassis 2700 and 2706 along with the operation button 2704 and the buttery 2705. A pixel region 2709 included in the panel 2701 is disposed so as to be visibly confirmed from an opening window provided for the chassis 2700.

The semiconductor device according to the invention has features of small size, thinning, and lightweight. According to the features, a limited space inside the chassis 2700 and 2706 of an electronic apparatus can be effectively utilized. A semiconductor device according to the invention has a feature of including a memory circuit having a simple structure, and according to the above feature, an electronic apparatus using a semiconductor device having an inexpensive and highly integrated memory circuit can be provided. Further, the semiconductor device according to the invention has a feature of including a memory circuit which is nonvolatile and able to write once and read many, and according to the above feature, an electronic apparatus in which a high function and a high added value are realized can be provided. In addition, the semiconductor device according to the invention has a transistor in which a single crystal semiconductor layer having favorable mobility or favorable response speed is used as a channel portion; therefore, an electronic apparatus using a semiconductor device which can operate at high speed and in which operating frequency is enhanced can be provided.

The semiconductor device according to the invention can be utilized for a wireless chip. For example, the semiconductor device can be used by being provided for paper money, coins, securities, certificates, bearer bonds, packing containers, documents, recording media, commodities, vehicles, foods, garments, health articles, livingwares, medicines, electronic devices, and the like. These examples are explained with reference to FIGS. 19A to 19H.

The paper money and coins are money distributed in the market and include currency such as cash vouchers available in a certain area in the same way as money, and memorial coins. The securities refer to checks, stock certificates, promissory notes, and the like (refer to FIG. 19A). The certificates refer to driver's licenses, certificates of residence, and the like (refer to FIG. 19B). The bearer bonds refer to stamps, rise coupons, various merchandise coupons, and the like (refer to FIG. 19C). The packing containers refer to wrapping paper for lunch, plastic bottles, and the like (refer to FIG. 19D). The documents refer to volumes, books and the like (refer to FIG. 19E). The recording media refer to DVD software, video tapes, and the like (refer to FIG. 19F). The vehicles refer to wheeled vehicles such as bicycles, vessels, and the like (refer to FIG. 19G). The commodities refer to bags, glasses, and the like (refer to FIG. 19H). The foods refer to food articles, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic apparatuses refer to liquid crystal display apparatuses, EL display apparatuses, television apparatuses (TV sets or flat-screen televisions), cellular phones, and the like.

Counterfeits can be prevented by providing a wireless chip to the paper money, coins, securities, certificates, bearer bonds, and the like. The efficiency of an inspection system or a system used in a rental shop can be promoted by providing a wireless chip to the packing containers, documents, recording media, commodities, foods, livingwares, electronic devices, or the like. By providing a wireless chip to each of the vehicles, health articles, medicines, and the like, counterfeits or theft can be prevented, further, medicines can be prevented from taking mistakenly. The wireless chip is provided for goods by pasting on their surfaces or embedding thereinto. For example, the wireless chip may be embedded in a paper in case of a book or embedded in an organic resin in case of a package formed from the organic resin. In the case of writing (writing once, reading many) by optical operation afterward, a transparent material is preferably used so that light can be emitted to a memory element provided for a chip. Further, counterfeits can be effectively prevented by using a memory element in which once-written data cannot be rewritten. Problems such as privacy after a user purchases a product can be solved by providing a system for erasing data of a memory element provided for a wireless chip.

The efficiency of an inspection system, a system used in a rental shop, or the like can be promoted by providing a wireless chip for, for example, packing containers, recording media, commodities, foods, garments, livingwares, electronic devices, or the like. Counterfeits or theft can be prevented by providing a wireless chip for vehicles. Individual creatures can be easily identified by implanting a wireless chip in creatures such as animals. For example, year of birth, sex, breed, and the like can be easily identified by implanting a wireless chip in creatures such as domestic animals.

As described above, a semiconductor device according to the invention can be provided for everything as long as they are goods which store data. This embodiment mode can be freely combined with the above embodiment modes.

Embodiment 1

In this embodiment, a result of writing data by electric action to an organic memory element manufactured over a substrate is explained.

An organic memory element is an element in which a first conductive layer, a first organic compound layer, a second organic compound layer, and a second conductive layer are sequentially stacked over a substrate. The first conductive layer is formed from a compound of silicon oxide and indium tin oxide; the first organic compound layer, 4,4'-bis[N-(3-methylphenyl)-N-phenylamino]biphenyl (this material may be abbreviated to TPD); the second organic compound layer, 4,4'-bis[N-(1-naphthyl)-N-phenylamino]biphenyl (this material may be abbreviated to α-NPD); and the second conductive layer, aluminum. The first organic compound layer is formed so as to have a film thickness of 10 nm; and the second organic compound layer, 50 nm. The size of the element is 2 mm×2 mm.

First, a measurement result of current-voltage characteristics of the organic memory element before writing data by electric action and after writing data by electric action is explained with reference to FIG. 16.

Figure 16:
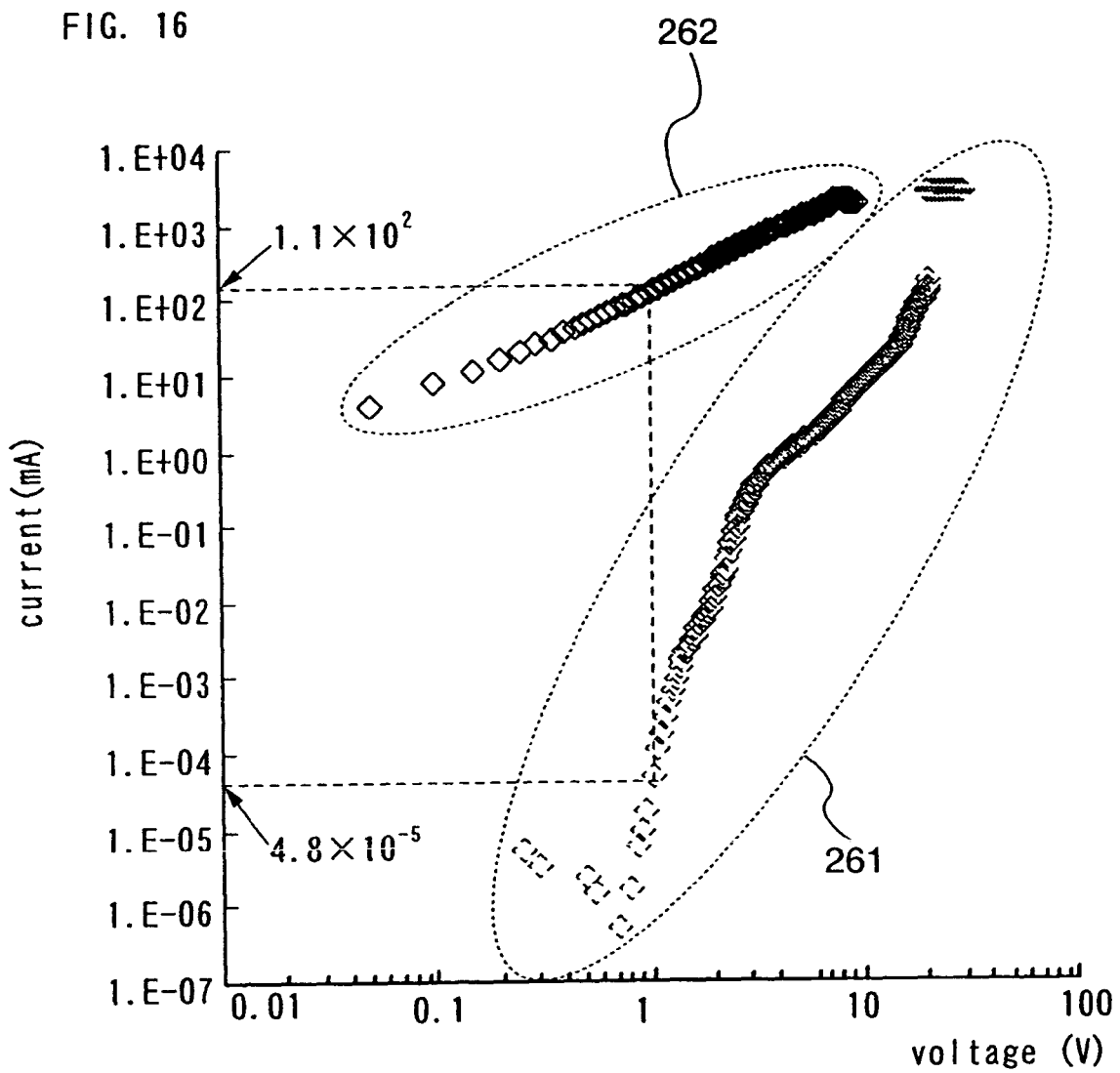
FIG. 16 is a view showing current-voltage characteristics of an organic memory element in a semiconductor device according to the invention.

In FIG. 16, a horizontal axis indicates a voltage value, a vertical axis indicates a current value, plots 261 indicate current-voltage characteristics of the organic memory element before writing data by electric action, and plots 262 indicate current-voltage characteristics of the organic memory element after writing data by electric action. The electric action is conducted by increasing voltage gradually from 0 V. As shown in the plots 261, a current value increases gradually as voltage increases, and a current value drastically increases approximately at 20 V. That is, this shows that writing to this element can be conducted at 20 V. Therefore, a curve in the range of 20 V or less of the plots 261 shows current-voltage characteristics of a memory cell in which writing is not conducted and the plots 262 show current-voltage characteristics of the memory cell in which writing is conducted.

FIG. 16 shows a substantial change in current-voltage characteristics of an organic memory element before and after writing data. For example, a current value before writing data is $4.8 \times 10^{-5}$ mA at an applied voltage 1 V, whereas a current value after writing data is $1.1 \times 10^{2}$ mA at an applied voltage 1 V; accordingly, a current value changes for seven-digit before and after writing data.

As described above, a resistance value of the organic memory element changes before and after writing data, and the organic memory element can serve as a memory circuit when the change of the resistance value of this organic memory element is read by a voltage value or a current value.

In the case of using an organic memory element as described above as a memory circuit, a predetermined voltage value (voltage value which is enough to keep from shortening) is applied to the organic memory element each time reading operation of data is conducted, then the resistance value is read. Therefore, current-voltage characteristics of the above organic memory element are required to have a characteristic which does not change even through reading operation is repeatedly conducted, that is, even though a predetermined voltage value is repeatedly applied.

A measurement result of current-voltage characteristics of an organic memory element after reading data is explained with reference to FIG. 17.

In this experiment, current-voltage characteristics of the organic memory element are measured each time reading operation of data is conducted one time. The reading operation of data is conducted five times in total; therefore, the current-voltage characteristics of the organic memory element are measured five times in total. The current-voltage characteristics are measured for two organic memory elements: an organic memory element in which a resistance value is changed and an organic memory element in which a resistance value is not changed, both of which result from writing data by electric action.

Figure 17:
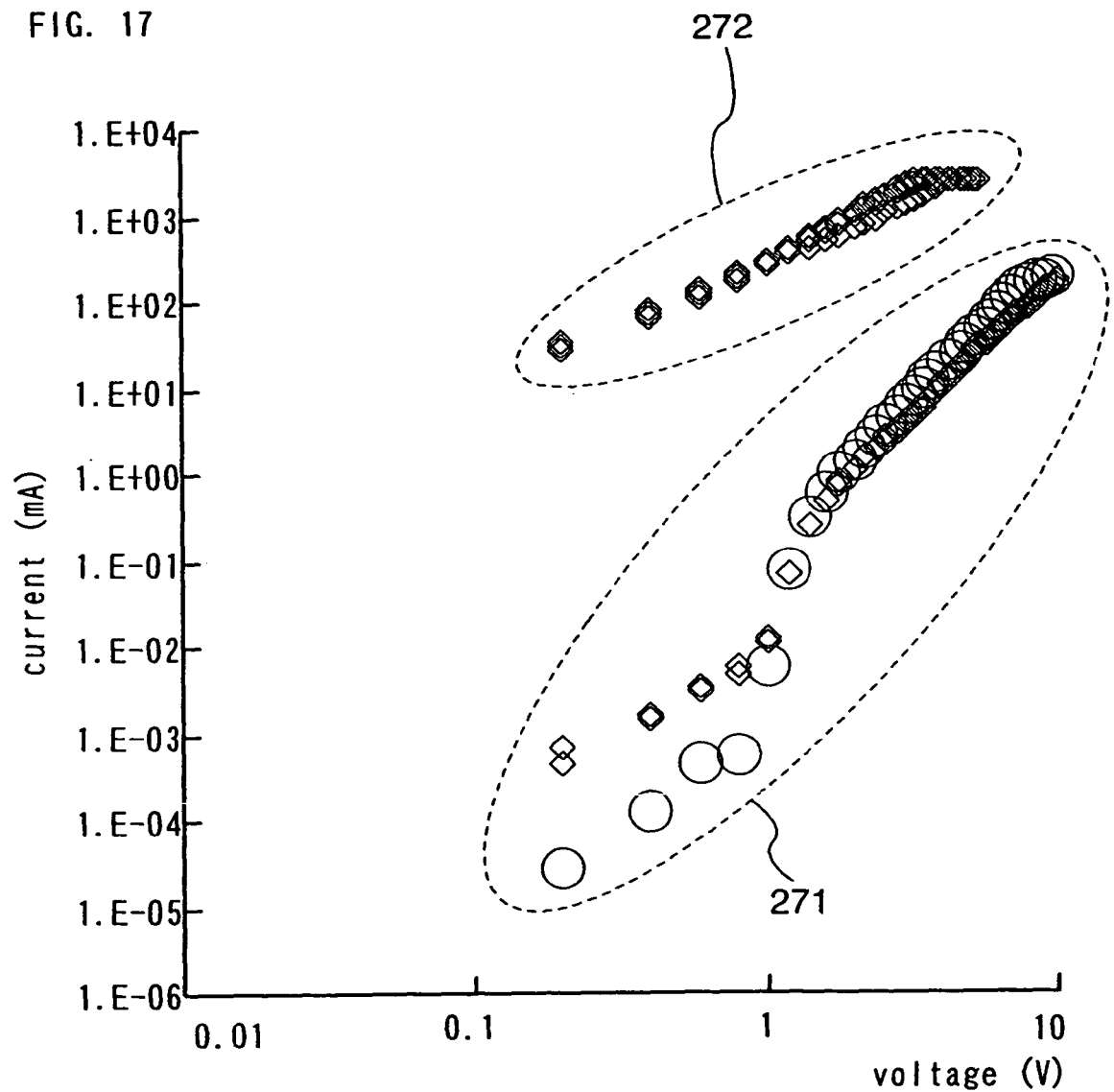
FIG. 17 is a view showing current-voltage characteristics of an organic memory element in a semiconductor device according to the invention.

In FIG. 17, a horizontal axis indicates a voltage value, a vertical axis indicates a current value, plots 272 indicate current-voltage characteristics of an organic memory element in which a resistance value is changed by writing data by electric action, and plots 271 indicate current-voltage characteristics of a organic memory element in which a resistance value is not changed.

As shown in the plots 271, current-voltage characteristics of the organic memory element before writing data show a favorable reproducibility especially at a voltage value of 1 V or more. Similarly, as shown in the plots 272, current-voltage characteristics of the organic memory element in which a resistance value is changed by writing data show a favorable reproducibility especially at a voltage value of 1 V or more.

From the above-described results, current-voltage characteristics are not changed even though reading operation of data is repeatedly conducted a plurality of times. Hence, the above organic memory element can be used as a memory circuit.

Embodiment 2

As for samples 1 to 6 in which an organic memory element is manufactured over a substrate as shown in FIGS. 24A to 24F, a measurement result of current density-voltage characteristics when data is electrically written to an organic memory element is shown in FIGS. 21A to 23B. Here, writing is conducted by applying voltage to the organic memory element and shortening the organic memory element.

In each of FIGS. 21A to 23B, a horizontal axis indicates voltage, a vertical axis indicates a current density value, circular plots indicate a measurement result of current density-voltage characteristics of the organic memory element before writing data, and square plots indicate a measurement result of current density-voltage characteristics of the organic memory element after writing data. The size of each samples 1 to 6 in a horizontal plane is 2 mm×2 mm.

Figure 21A:
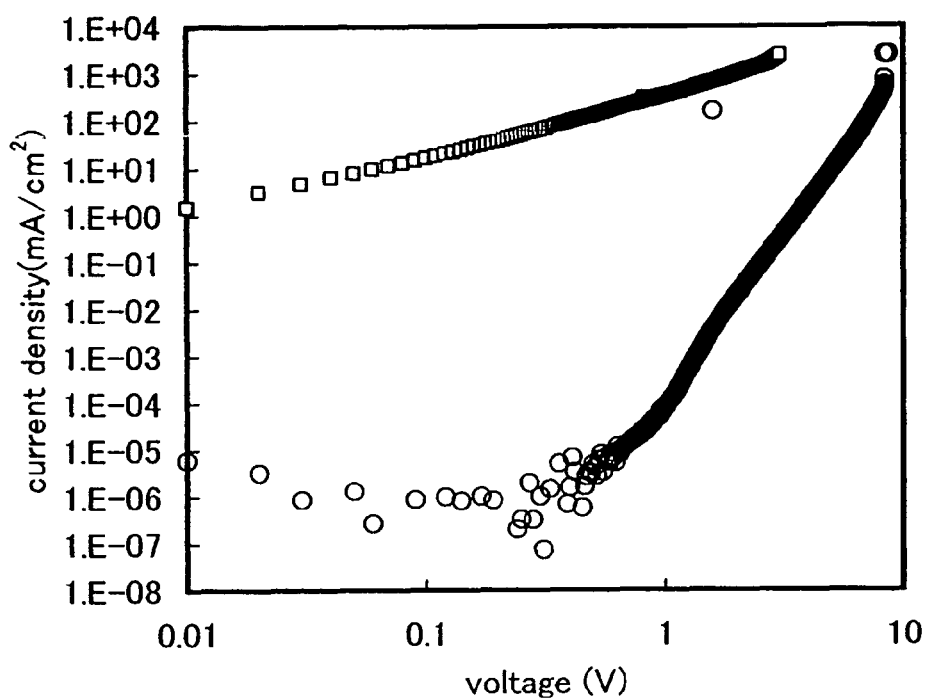
FIGS. 21A and 21B are views showing current density-voltage characteristics of an organic memory element in a semiconductor device according to the invention.
Figure 24A:
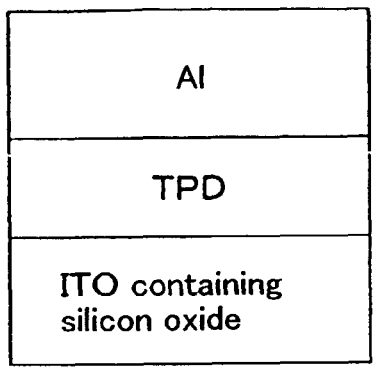
FIGS. 24A to 24F are views showing an element structure of an organic memory element in a semiconductor device according to the invention.

The sample 1 is an element in which a first conductive layer, a first organic compound layer, and a second conductive layer are sequentially stacked. Here, as shown in FIG. 24A, the first conductive layer is formed from ITO containing silicon oxide; the first organic compound layer, TPD; and the second conductive layer, aluminum. The first organic compound layer is formed so as to have a thickness of 50 nm. A measurement result of current density-voltage characteristics of the sample 1 is shown in FIG. 21A.

Figure 21B:
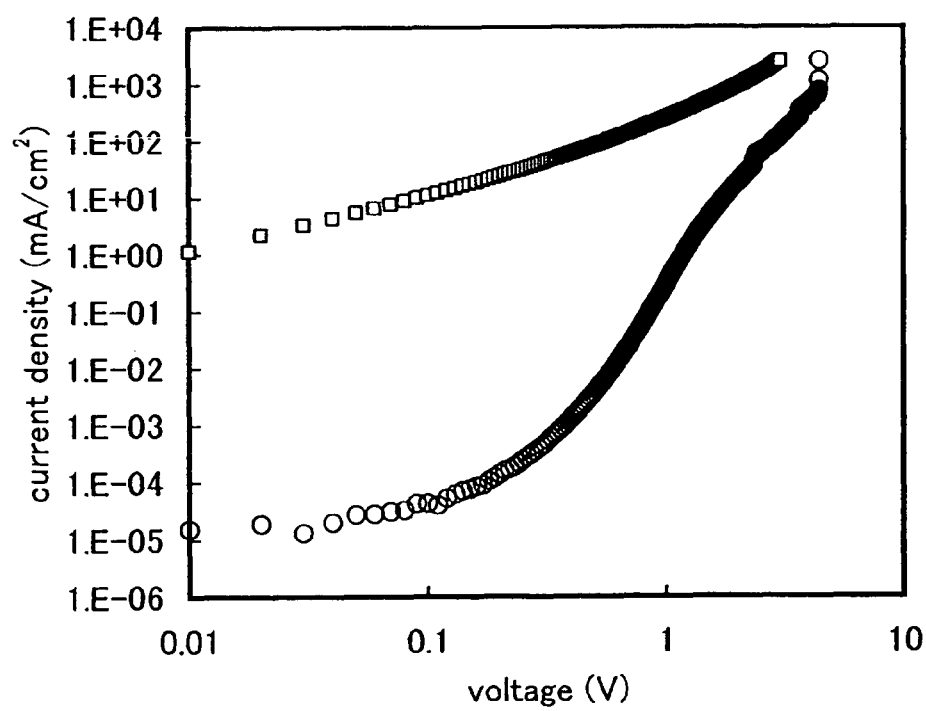
Figure 24B:
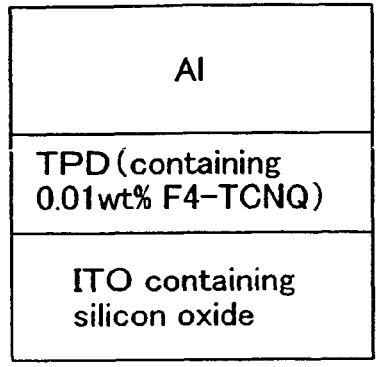

The sample 2 is an element in which a first conductive layer, a first organic compound layer, and a second conductive layer are sequentially stacked. Here, as shown in FIG. 24B, the first conductive layer is formed from ITO containing silicon oxide; the first organic compound layer, TPD added with 2,3,5,6-tetrafluoro-7,7,8,8-tetracyanoquinodimethane (this material may be abbreviated to F4-TCNQ); and the second conductive layer, aluminum. The first organic compound layer is formed so as to have a thickness of 50 nm and by adding 0.01 wt % F4-TCNQ. A measurement result of current density-voltage characteristics of the sample 2 is shown in FIG. 21B.

Figure 22A:
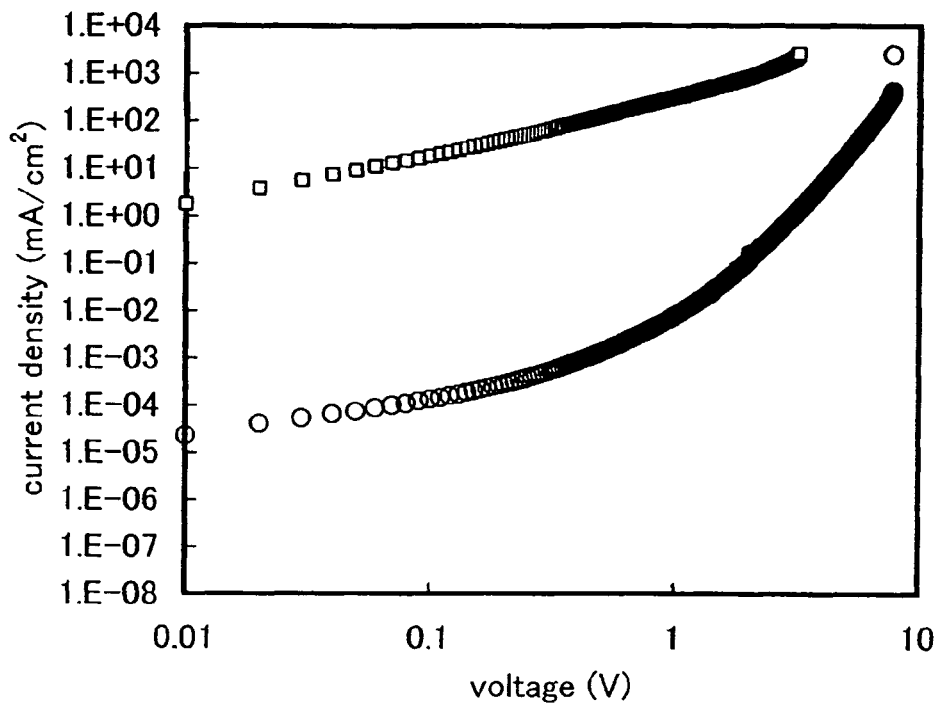
FIGS. 22A and 22B are views showing current density-voltage characteristics of an organic memory element in a semiconductor device according to the invention.
Figure 24C:
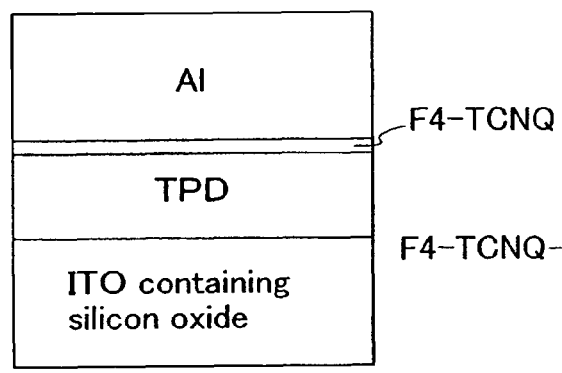

The sample 3 is an element in which a first conductive layer, a first organic compound layer, a second organic compound layer, and a second conductive layer are sequentially stacked. Here, as shown in FIG. 24C, the first conductive layer is formed from ITO containing silicon oxide; the first organic compound layer, TPD; the second organic compound layer, F4-TCNQ; and the second conductive layer, aluminum. The first organic compound layer is formed so as to have a thickness of 50 nm, and the second organic compound layer is formed so as to have a thickness of 1 nm. A measurement result of current density-voltage characteristics of the sample 3 is shown in FIG. 22A.

Figure 22B:
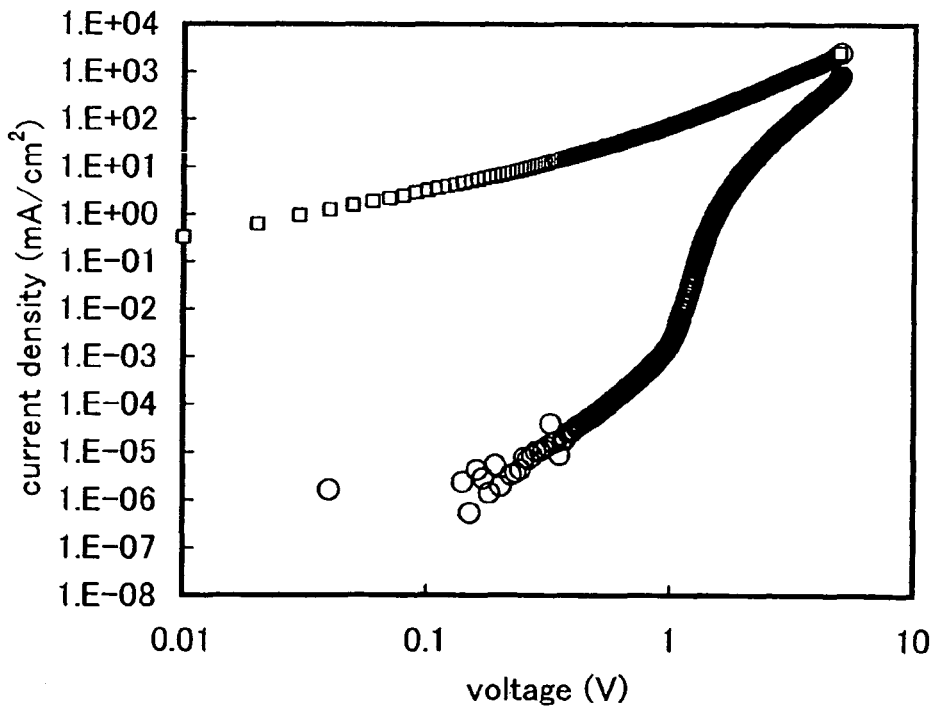
Figure 24D:
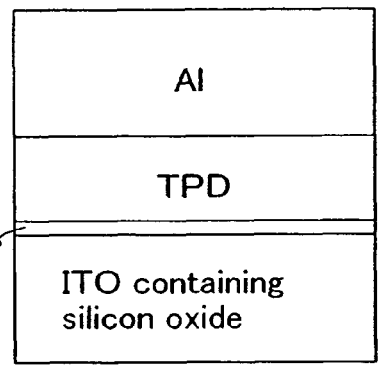

The sample 4 is an element in which a first conductive layer, a first organic compound layer, a second organic compound layer, and a second conductive layer are sequentially stacked. Here, as shown in FIG. 24D, the first conductive layer is formed from ITO containing silicon oxide; the first organic compound layer, F4-TCNQ; the second organic compound layer, TPD; and the second conductive layer, aluminum. The first organic compound layer is formed so as to have a thickness of 1 nm, and the second organic compound layer is formed so as to have a thickness of 50 nm. A measurement result of current density-voltage characteristics of the sample 4 is shown in FIG. 22B.

Figure 23A:
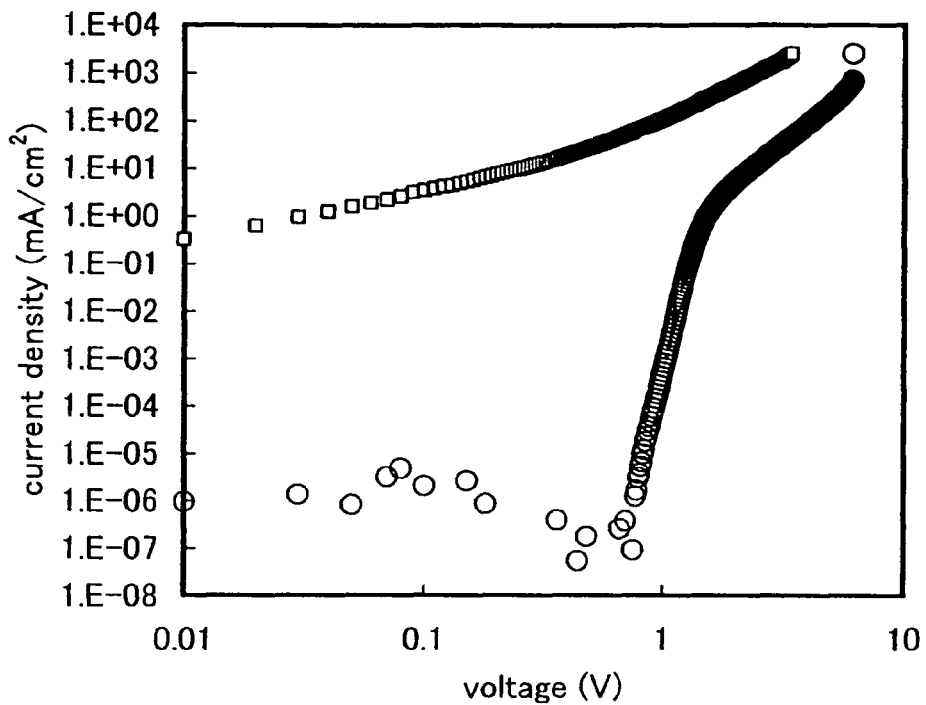
FIGS. 23A and 23B are views showing current density-voltage characteristics of an organic memory element in a semiconductor device according to the invention.
Figure 24E:
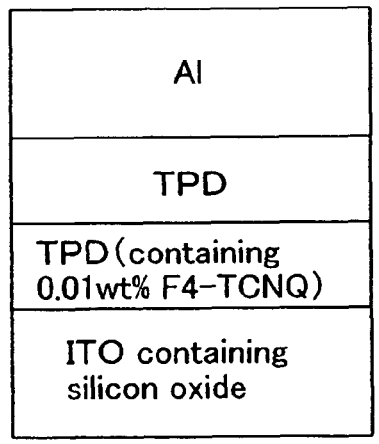

The sample 5 is an element in which a first conductive layer, a first organic compound layer, a second organic compound layer, and a second conductive layer are sequentially stacked. Here, as shown in FIG. 24E, the first conductive layer is formed from ITO containing silicon oxide; the first organic compound layer, TPD added with F4-TCNQ; the second organic compound layer, TPD; and the second conductive layer, aluminum. The first organic compound layer is formed so as to have a thickness of 40 nm and by adding 0.01 wt % F4-TCNQ, and the second organic compound layer is formed so as to have a thickness of 40 nm. A measurement result of current density-voltage characteristics of the sample 5 is shown in FIG. 23A.

Figure 23B:
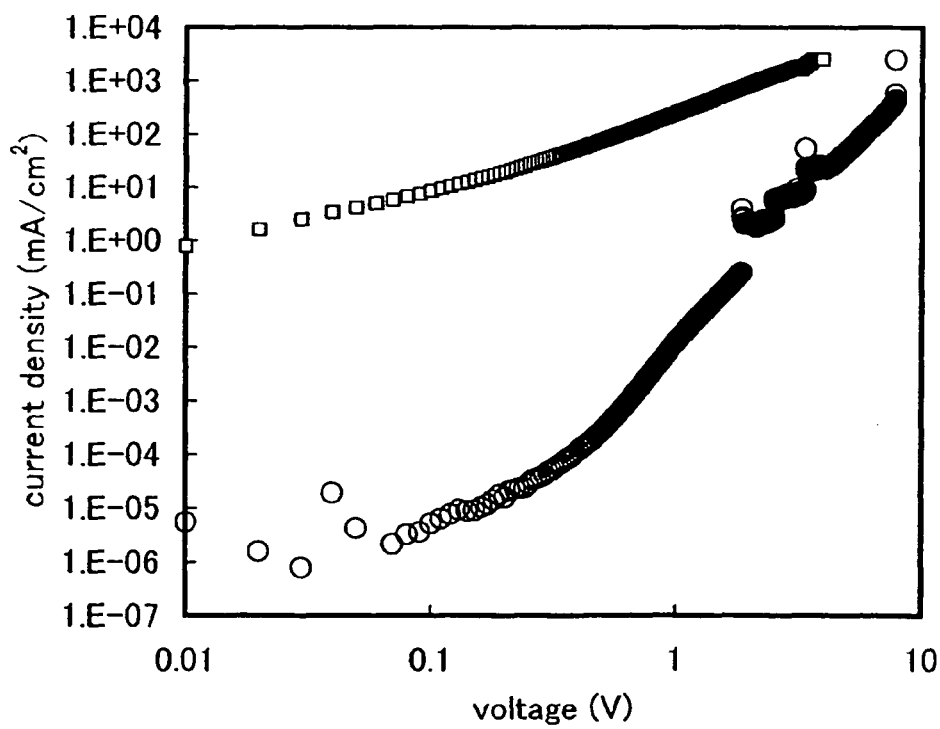
Figure 24F:
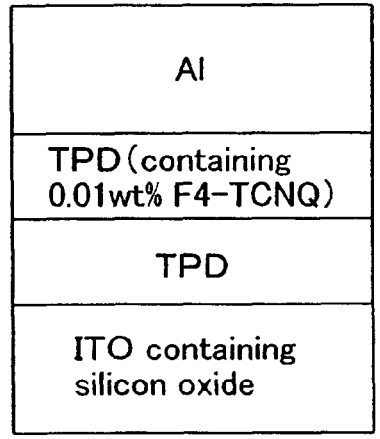

The sample 6 is an element in which a first conductive layer, a first organic compound layer, a second organic compound layer, and a second conductive layer are sequentially stacked. Here, as shown in FIG. 24F, the first conductive layer is formed from ITO containing silicon oxide; the first organic compound layer, TPD; the second organic compound layer, TPD added with F4-TCNQ; and the second conductive layer, aluminum. The first organic compound layer is formed so as to have a thickness of 40 nm. The second organic compound layer is formed so as to have a film thickness of 10 nm and by adding 0.01 wt % F4-TCNQ. A measurement result of current density-voltage characteristics of the sample 6 is shown in FIG. 23B.

The experiment results shown in FIGS. 21A to 23B also show a substantial change in current density-voltage characteristics of the organic memory element before and after shortening the organic memory element. In such an organic memory element of these samples, there is reproducibility in voltage which shortens each organic memory element, and the discrepancy is within 0.1 V.

Next, a writing voltage and characteristics before and after writing of the samples 1 to 6 are shown in Table 1.

TABLE 1

|  | writing voltage(V) | R(1 V) | R(3 V) |
|---|---|---|---|
| sample 1 | 8.4 | 1.9E+07 | 8.4E+03 |
| sample 2 | 4.4 | 8.0E+08 | 2.1E+02 |
| sample 3 | 3.2 | 8.7E+04 | 2.0E+02 |
| sample 4 | 5.0 | 3.7E+04 | 1.0E+01 |
| sample 5 | 6.1 | 2.0E+05 | 5.9E+01 |
| sample 6 | 7.8 | 2.0E+04 | 2.5E+02 |

In Table 1, a writing voltage (V) indicates an applied voltage when each organic memory element is shortened. R(1V) is a value that current density at applying 1 V to the organic memory element after writing is divided by current density at applying 1 V to the organic memory element before writing. Similarly, R(3V) is a value that current density at applying 3 V to the organic memory element after writing is divided by current density at applying 3 V to the organic memory element before writing. That is, Table 1 indicates the change of current density before and after writing to the organic memory element. In the case where an applied voltage is 1 V, it is found that the difference in current density of the organic memory element is as large as 4-plex or more compared with the case where an applied voltage is 3 V.

This application is based on Japanese Patent Application serial No. 2004-308838 field in Japan Patent Office on Oct. 22, 2004, the contents of which are hereby incorporated by reference.

EXPLANATION OF REFERENCE

302: single crystal semiconductor substrate, 303: n-well, 304: n-well, 305: p-well, 306: p-well, 307: field oxide film, 308: gate insulating film, 309: gate insulating film, 310: gate insulating film, 311: gate insulating film, 312: gate, 312a: polycrystalline silicon layer, 312b: silicide layer, 313: gate, 313a: polycrystalline silicon layer, 313b: silicide layer, 314: gate, 314a: polycrystalline silicon layer, 314b: silicide layer, 315: gate, 315a: polycrystalline silicon layer, 315b: silicide layer, 316: p-channel FET, 317: n-channel FET, 318: p-channel FET, 319: n-channel FET, 320: low concentration impurity region (LDD region), 321: low concentration impurity region (LDD region), 322: low concentration impurity region (LDD region), 323: low concentration impurity region (LDD region), 324: sidewall, 325: sidewall, 326: sidewall, 327: sidewall, 328: source/drain region, 329: source/drain region, 330: source/drain region, 331: source/drain region, 332: insulating layer, 333: insulating layer, 334: source/drain wiring, 335 source/drain wiring, 336: source/drain wiring, 337: source/drain wiring, 338: source/drain wiring, 339: source/drain wiring, 340: source/drain wiring, 341: source/drain wiring, 342: insulating layer, 343: insulating layer, 345: first conductive layer, 346: organic compound layer, 347: second conductive layer, 348: insulating layer, 349: insulating layer, 350: memory element, 351: layer, 352: layer, 361: first conductive layer, 362: first conductive layer, 363: first conductive layer, 364: first conductive layer, 365: organic compound layer, 367: organic compound layer, 368: organic compound layer, 369: second conductive layer, 370: insulating layer, 371: memory element, 372: memory element, 373: memory element, 374: memory element, 375: insulating layer, 401: layer, 402: layer, 403: conductive layer, 445: first conductive layer, 446: organic compound layer, 447: second conductive layer, 448 insulating layer, 449: insulating layer, 450: memory element, 462: first conductive layer, 463: first conductive layer, 466: organic compound layer, 467: organic compound layer, 469: second conductive layer, 470: insulating layer, 472: memory element, 473: memory element, 475: insulating layer, 501: layer, 502: layer, 503: conductive layer, 504: substrate, 505: resin, 506: conductive particle, 21: memory cell, 22 memory cell array, 23: decoder, 24: decoder, 25: selector, 26: reading/writing circuit, 27: first conductive layer, 28: second conductive layer, 29: organic compound layer, 30: substrate, 33: insulating layer, 34: insulating layer, 44: semiconductor layer, 45: semiconductor layer, 46: resistance element, 47: differential amplifier, 216: memory, 221: memory cell, 222: memory cell array, 223: decoder, 224: decoder, 225: selector, 226: reading/writing circuit, 232: laser irradiation apparatus, 240: transistor, 241: memory element, 246: resistance element, 247: differential amplifier, 261: plot, 262: plot, 271: plot, 272: plot, 1001: laser irradiation apparatus, 1002: PC, 1003: laser oscillator, 1004: power supply, 1005: optical system, 1006: acousto-optic modulator, 1007: optical system, 1009: movement mechanism, 1011: driver, 1012: driver, 1013: autofocusing mechanism, 2001: chassis, 2002: display portion, 2003: operation button, 2004: lid, 2005: handle, 2101: chassis, 2102: display portion, 2103: operation button, 2104: window, 2105: handle, 2201: chassis, 2202: display portion, 2203: operation button, 2204: lid, 2205: hose, 2700: chassis, 2701: panel, 2702: housing, 2703: printed wiring board, 2704: operation button, 2705: battery, 2706: chassis, 2708: connection film, 2709: pixel region, 3010: memory means, 3020: control means, 3030: power generation means, 3040: IC chip, 3050: antenna, 3060: wireless chip, 3070: reader/writer, 3200: reader/writer, 3210: display portion, 3220: article, 3230: wireless chip, 3240: reader/writer, 3250: wireless chip, 3260: product

The invention claimed is:

1. A semiconductor device comprising:
a field effect transistor having a channel region formed in a single crystal semiconductor substrate;
a memory circuit provided above the field effect transistor, wherein the memory circuit includes an organic memory element comprising:
   a first conductive layer electrically connected to the field effect transistor,
   an insulating layer provided so as to cover an edge portion of the first conductive layer,
   an organic compound layer provided over the first conductive layer and the insulating layer, and
   a second conductive layer provided over the organic compound layer; and
a third conductive layer serving as an antenna,
wherein the third conductive layer serving as the antenna and the first conductive layer are provided in a same layer.

2. A semiconductor device comprising:
a first field effect transistor and a second field effect transistor each having a channel region formed in a single crystal semiconductor substrate;
a memory circuit provided above the first field effect transistor and the second field effect transistor, wherein the memory circuit includes an organic memory element comprising:
   a first conductive layer electrically connected to the first field effect transistor,
   an insulating layer provided so as to cover an edge portion of the first conductive layer,
   an organic compound layer provided over the first conductive layer and the insulating layer, and
   a second conductive layer provided over the organic compound layer; and
a third conductive layer serving as an antenna, which is provided above the memory circuit,
wherein the third conductive layer serving as the antenna is electrically connected to the second field effect transistor.

3. A semiconductor device comprising:
a field effect transistor having a channel region formed in a single crystal semiconductor substrate;
a memory circuit provided above the field effect transistor, wherein the memory circuit includes an organic memory element comprising:
   a first conductive layer electrically connected to the field effect transistor,
   an insulating layer provided so as to cover an edge portion of the first conductive layer,
   an organic compound layer provided so as to cover the first conductive layer which is not covered with the insulating layer and an edge portion of the insulating layer, and
   a second conductive layer provided so as to cover the organic compound layer and the insulating layer which is not covered with the organic compound layer; and
a third conductive layer serving as an antenna,
wherein the third conductive layer serving as the antenna and the first conductive layer are provided in a same layer.

4. A semiconductor device comprising:
a first field effect transistor and a second field effect transistor each having a channel region formed in a single crystal semiconductor substrate;
a memory circuit provided above the first field effect transistor and the second field effect transistor, wherein the memory circuit includes an organic memory element comprising:
   a first conductive layer electrically connected to the first field effect transistor, an insulating layer provided so as to cover an edge portion of the first conductive layer;
   an organic compound layer provided so as to cover the first conductive layer which is not covered with the insulating layer and an edge portion of the insulating layer; and
   a second conductive layer provided so as to cover the organic compound layer and the insulating layer which is not covered with the organic compound layer; and
a third conductive layer serving as an antenna, which is provided above the memory circuit,
wherein the third conductive layer serving as the antenna is electrically connected to the second field effect transistor.

5. The semiconductor device according to claim 2 or claim 4,
wherein the third conductive layer serving as the antenna is electrically connected to the field effect transistor through a conductive particle.

6. The semiconductor device according to any one of claims 1, 2, 3 and 4,
wherein the second conductive layer has a light transmitting property.

7. The semiconductor device according to any one of claims 1, 2, 3 and 4,
wherein resistance of the organic memory element changes irreversibly by writing processing that voltage is applied.

8. The semiconductor device according to any one of claims 1, 2, 3 and 4,
wherein a distance between the first conductive layer and the second conductive layer of the organic memory element changes when data is written to the memory element.

9. The semiconductor device according to any one of claims 1, 2, 3 and 4,
wherein the organic compound layer is formed from an electron transporting material or a hole transporting material.

10. The semiconductor device according to any one of claims 1, 2, 3 and 4,
wherein conductivity of the organic compound layer is $10^{-15}$ S/cm or more to $10^{-3}$ S/cm or less.

11. The semiconductor device according to any one of claims 1, 2, 3 and 4,
wherein a film thickness of the organic compound layer is 5 nm to 60 nm.

12. The semiconductor device according to any one of claims 1, 2, 3 and 4,
wherein the organic compound layer includes a material in which electric resistance changes before and after irradiating the organic compound layer with light.

13. The semiconductor device according to claim 12,
wherein conductivity of the organic compound layer changes before and after irradiating the organic compound layer with laser light.

14. The semiconductor device according to any one of claims 1, 2, 3 and 4,
wherein said semiconductor device further comprises one or a plurality of circuits selected from the group consisting of a power supply circuit, a clock generator circuit, a data demodulator/modulator circuit, and an interface circuit is included.

15. The semiconductor device according to any one of claims 1, 2, 3 and 4,
wherein the organic compound layer comprises a conjugated polymer doped with a compound which generates acid by absorbing light.

16. The semiconductor device according to claim 15,
wherein the compound which generates acid comprises at least one of aryl sulfonium salt, aryl iodonium salt, o-nitrobenzyl tosylate, aryl sulfonic acid p-nitrobenzyl ester, sulfonyl acetophenones, and Fe-arene complex $PF_6$ salt.

* * * * *